(12) United States Patent
Chang et al.

(10) Patent No.: US 11,798,954 B2
(45) Date of Patent: Oct. 24, 2023

(54) DISPLAY DEVICE

(71) Applicant: Samsung Display Co., Ltd., Yongin-si (KR)

(72) Inventors: Chong Sup Chang, Hwaseong-si (KR); Eui Kang Heo, Seoul (KR); Young Seok Baek, Hwaseong-si (KR); Ha Na Seo, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 434 days.

(21) Appl. No.: 17/020,579

(22) Filed: Sep. 14, 2020

(65) Prior Publication Data

US 2021/0159250 A1 May 27, 2021

(30) Foreign Application Priority Data

Nov. 26, 2019 (KR) .......................... 10-2019-0153363

(51) Int. Cl.
   *H01L 27/12* (2006.01)
(52) U.S. Cl.
   CPC .................................. *H01L 27/124* (2013.01)
(58) Field of Classification Search
   CPC .... H01L 27/124; H01L 27/156; H01L 25/167
   See application file for complete search history.

(56) References Cited

U.S. PATENT DOCUMENTS

| | | |
|---|---|---|
| 2016/0322437 A1 | 11/2016 | Sakamoto et al. |
| 2017/0192300 A1 | 7/2017 | Chung et al. |
| 2018/0175106 A1 | 6/2018 | Kim et al. |
| 2018/0211945 A1 | 7/2018 | Cok et al. |
| 2019/0244985 A1* | 8/2019 | Kim ...................... H01L 25/167 |
| 2020/0168661 A1 | 5/2020 | Xue |

(Continued)

FOREIGN PATENT DOCUMENTS

| | | |
|---|---|---|
| CN | 109 285 856 A | 1/2019 |
| EP | 3890015 A1 | 10/2021 |

(Continued)

OTHER PUBLICATIONS

Extended European Search Report dated Oct. 4, 2021 for corresponding European Application No. 20203417.9 (11 pages).

(Continued)

*Primary Examiner* — Peter M Albrecht
(74) *Attorney, Agent, or Firm* — Lewis Roca Rothgerber Christie LLP

(57) ABSTRACT

A display includes a substrate, a first electrode base layer and a second electrode base layer spaced from each other on the substrate, a first electrode on the first electrode base layer and a second electrode on the second electrode base layer, a first inner bank between the first electrode base layer and the first electrode and a second inner bank between the second electrode base layer and the second electrode, and a light emitting element between the first electrode and the second electrode, at least one end portion of the light emitting element being electrically connected to the first electrode or the second electrode, wherein a side surface of one end portion of each of the first and second electrode base layers is at the same line as a side surface of an end portion of a corresponding one of the first and second electrodes.

29 Claims, 24 Drawing Sheets

(56) References Cited

U.S. PATENT DOCUMENTS

2021/0126172 A1\*  4/2021  Eom .................... H01L 25/167
2021/0305222 A1   9/2021  Min et al.
2021/0343781 A1\* 11/2021  Lu ........................ H01L 27/156

FOREIGN PATENT DOCUMENTS

| KR | 10-2010-0125502 A | 12/2010 |
|----|-------------------|---------|
| KR | 10-1595449 B1 | 2/2016 |
| KR | 10-2018-0072909 A | 7/2018 |
| KR | 10-2019-0029831 A | 3/2019 |
| WO | WO 2020-013403 A1 | 1/2020 |
| WO | WO 2020-071614 A1 | 4/2020 |
| WO | WO 2020/111391 A1 | 6/2020 |
| WO | WO 2020-197080 A1 | 10/2020 |

OTHER PUBLICATIONS

Extended European Search Report dated Dec. 14, 2021 for corresponding European Application No. 20203417.9 (18 pages).

\* cited by examiner

DISPLAY DEVICE

CROSS-REFERENCE TO RELATED APPLICATION

This application claims priority to and the benefit of Korean Patent Application No. 10-2019-0153363, filed on Nov. 26, 2019 in the Korean Intellectual Property Office, the disclosure of which is incorporated herein by reference in its entirety.

BACKGROUND

1. Field

The present disclosure relates to a display device.

2. Description of the Related Art

Display devices are becoming increasingly important with the development of multimedia. Accordingly, various types of display devices such as organic light emitting displays and liquid crystal displays are being used.

A display device is a device for displaying an image and includes a display panel such as an organic light emitting display panel or a liquid crystal display panel. A light emitting display panel may include light emitting elements such as light emitting diodes (LEDs). For example, the LEDs may be organic light emitting diodes (OLEDs) using an organic material as a fluorescent material or may be inorganic LEDs using an inorganic material as the fluorescent material.

SUMMARY

Aspects of the present disclosure provide a display device in which an area where a light emitting element is disposed is separated from an area where circuit elements are disposed.

Aspects of the present disclosure also provide a display device which can be manufactured through a reduced number of processes because electrodes and circuit elements or wirings electrically connected to a light emitting element are formed in the same process.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to some example embodiments of the present disclosure, a display device includes a substrate, a first electrode base layer and a second electrode base layer spaced from each other on the substrate, a first electrode on the first electrode base layer and a second electrode on the second electrode base layer, a first inner bank between the first electrode base layer and the first electrode and a second inner bank between the second electrode base layer and the second electrode and a light emitting element between the first electrode and the second electrode, at least one end portion of the light emitting element being electrically connected to the first electrode or the second electrode, wherein a side surface of at least one end portion of each of the first electrode base layer and the second electrode base layer is at the same line as a side surface of an end portion of a corresponding one of the first electrode and the second electrode.

In some example embodiments, the first electrode may cover an outer surface of the first inner bank, and the second electrode may cover an outer surface of the second inner bank.

In some example embodiments, at least a portion of a lower surface of the first electrode may directly contact an upper surface of the first electrode base layer, and at least a portion of a lower surface of the second electrode may directly contact an upper surface of the second electrode base layer.

In some example embodiments, at least one side surface of each of the first electrode base layer and the second electrode base layer may not contact a corresponding one of the first electrode and the second electrode.

In some example embodiments, the first electrode and the second electrode may not directly contact the substrate.

In some example embodiments, the first inner bank and the second inner bank may be directly on the first electrode base layer and the second electrode base layer, respectively.

In some example embodiments, a distance between the first electrode and the second electrode may be smaller than a distance between the first inner bank and the second inner bank.

In some example embodiments, at least one end portion of the light emitting element may be on the first electrode or the second electrode.

In some example embodiments, the display device may further include a first insulating layer between the first electrode and the second electrode and covering at least a portion of each of the first electrode and the second electrode, wherein the light emitting element may be on the first insulating layer.

In some example embodiments, the first electrode base layer and the second electrode base layer may directly contact the first insulating layer.

In some example embodiments, the display device may further include a first contact electrode contacting an end portion of the light emitting element and the first electrode and a second contact electrode contacting the other end portion of the light emitting element and the second electrode.

In some example embodiments, the substrate includes an emission area and a non-emission area, and the first electrode, the second electrode, and the light emitting element may be in the emission area, and the display device may further include a first data conductive layer in the non-emission area.

In some example embodiments, the display device may further include a first interlayer insulating layer on the substrate, wherein the first data conductive layer and the first electrode base layer may be directly on the first interlayer insulating layer.

In some example embodiments, the first electrode may be electrically connected to the first data conductive layer.

In some example embodiments, the substrate further includes a non-display area, and the non-display area may further include a pad base layer in the non-display area and a pad electrode on the pad base layer.

In some example embodiments, the pad base layer may be at the same layer as the first electrode base layer, and the pad electrode may be at the same layer as the first electrode.

In some example embodiments, the display device may further include a first planarization layer on the first data conductive layer in the non-emission area and an outer bank surrounding the first electrode and the second electrode in the emission area, wherein the first planarization layer, the outer bank and the first inner bank may be at the same layer.

In some example embodiments, the first planarization layer, the outer bank and the first inner bank may have different heights.

In some example embodiments, the display device may further include a data line which is between the outer bank and the substrate, wherein at least one side surface of the data line may not contact the outer bank.

According to some example embodiments of the present disclosure, a display device includes a substrate having an emission area and a non-emission area, a first interlayer insulating layer on the substrate, a first data conductive layer on the first interlayer insulating layer and including source/drain electrodes of a driving transistor and a plurality of electrode base layers in the emission area, a via layer on the first data conductive layer and including a first planarization layer in the non-emission area and inner banks on the electrode base layers, a plurality of electrodes on the electrode base layers and a plurality of light emitting elements between the electrodes, wherein the electrode base layers include a first electrode base layer and a second electrode base layer spaced from the first electrode base layer, the electrodes include a first electrode on the first electrode base layer and a second electrode on the second electrode base layer, and the light emitting elements are between the first electrode and the second electrode.

In some example embodiments, the inner banks may include a first inner bank between the first electrode base layer and the first electrode and a second inner bank between the second electrode base layer and the second electrode, and the first electrode and the second electrode may cover outer surfaces of the first inner bank and the second inner bank, respectively.

In some example embodiments, a width of the first inner bank measured in a direction may be smaller than a width of the first electrode base layer measured in the direction.

In some example embodiments, at least a portion of a lower surface of the first electrode may directly contact the first electrode base layer.

In some example embodiments, a height of the first planarization layer may be greater than heights of the inner banks.

In some example embodiments, the via layer may further include an outer bank at a periphery of the emission area, wherein a height of the outer bank may be greater than the heights of the inner banks but is less than the height of the first planarization layer.

In some example embodiments, the substrate further includes a non-display area, the first data conductive layer may further include a pad base layer in the non-display area, and a pad electrode may be further on the pad base layer.

In some example embodiments, the pad electrode may be at the same layer as the first electrode.

In some example embodiments, a width of the pad base layer measured in a direction may be substantially the same as a width of the pad electrode measured in the direction.

In some example embodiments, the display device may further include a semiconductor layer on the non-emission area of the substrate and including a first active material layer of the driving transistor, a first gate insulating layer on the semiconductor layer and a first gate electrode of the driving transistor on the first gate insulating layer, wherein the source/drain electrodes of the driving transistor may contact the first active material layer through contact holes penetrating the first interlayer insulating layer and the first gate insulating layer.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Figure 1:
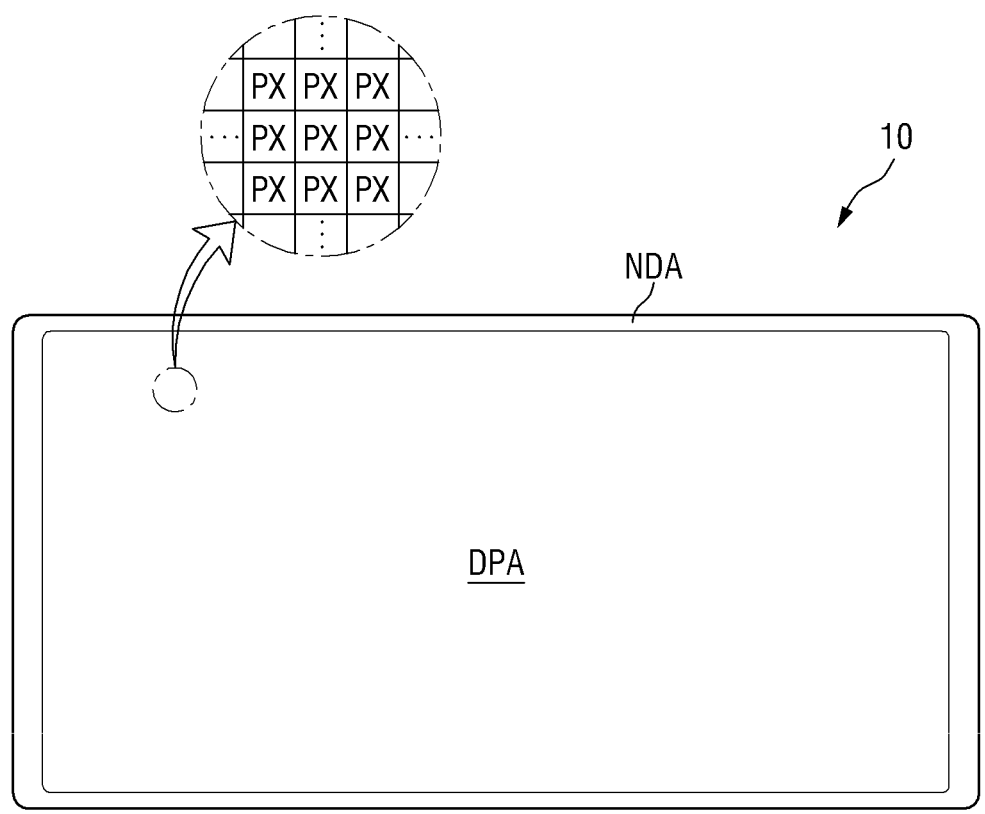
FIG. 1 is a plan view of a display device, according to some embodiments of the present disclosure.

The present disclosure will now be described more fully hereinafter with reference to the accompanying drawings, in which example embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Hereinafter, embodiments will be described with reference to the attached drawings.

FIG. 1 is a schematic plan view of a display device 10, according to some embodiments of the present disclosure.

Referring to FIG. 1, the display device 10 displays moving images or still images. The display device 10 may refer to any electronic device that includes a display screen. Non-limiting examples of the display device 10 may include televisions, notebook computers, monitors, billboards, the Internet of things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras and camcorders, all of which provide a display screen.

The display device 10 includes a display panel that provides a display screen. Non-limiting examples of the display panel include light emitting diode (LED) display panels, organic light emitting display panels, quantum dot light emitting display panels, plasma display panels, and field emission display panels. A case where an LED display panel is applied as an example of the display panel will be described below, but embodiments are not limited to this case, and other display panels can also be applied as long as the same technical spirit is applicable.

The shape of the display device 10 can be variously modified. For example, the display device 10 may have various shapes such as a horizontally long rectangle, a vertically long rectangle, a square, a quadrilateral with rounded corners (vertices), other polygons, and a circle. The shape of a display area DPA of the display device 10 may also be similar to the overall shape of the display device 10. In FIG. 1, each of the display device 10 and the display area DPA is shaped like a horizontally long rectangle.

The display device 10 may include the display area DPA and a non-display area NDA. The display area DPA may be an area where an image can be displayed, and the non-display area NDA may be an area where no image is displayed. The display area DPA may also be referred to as an active area, and the non-display area NDA may also be referred to as an inactive area. The display area DPA may generally occupy a center portion of the display device 10.

The display area DA may include a plurality of pixels PX. The pixels PX may be arranged along matrix directions (e.g., the pixels may be arranged in a matrix form). Each of the pixels PX may be rectangular or square in plan view. However, the shape of each of the pixels PX is not limited to these examples and may also be a rhombic shape having each side inclined with respect to a direction. The pixels PX may be alternately arranged in a stripe or pentile pattern. In some embodiments, each of the pixels PX may include one or more light emitting elements 300 which emit light of a specific wavelength band to display a specific color.

The non-display area NDA may be disposed around the display area DPA. The non-display area NDA may completely or partially surround the display area DPA. The display area DPA may be rectangular, and the non-display area NDA may be disposed adjacent to four sides of the display area DPA. The non-display area NDA may form a bezel of the display device 10.

Figure 2:
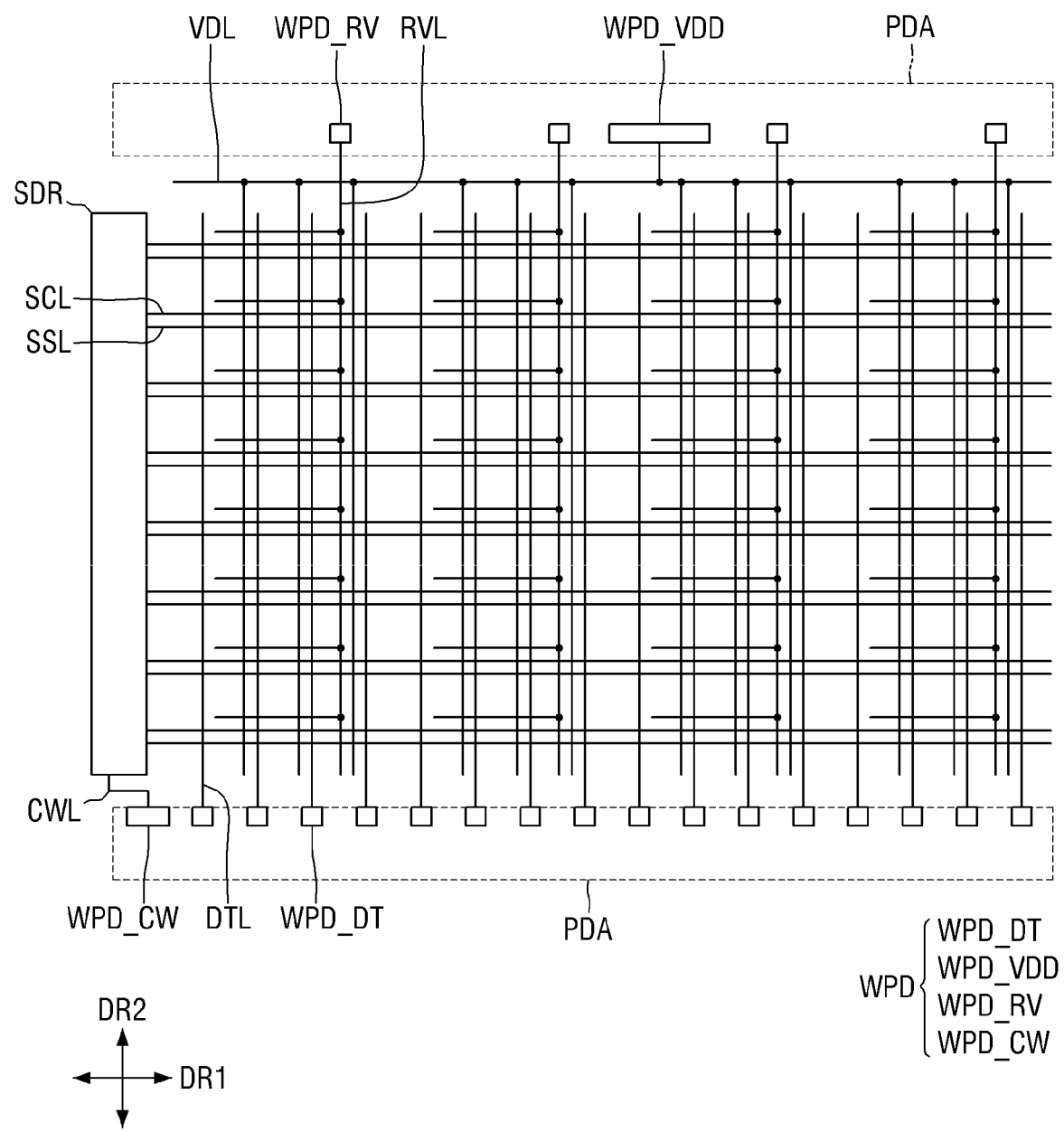
FIG. 2 is a schematic plan view illustrating the arrangement of wirings included in the display device, according to some embodiments of the present disclosure.

FIG. 2 is a schematic plan view illustrating the arrangement of wirings included in the display device 10, according to some embodiments of the present disclosure.

Referring to FIG. 2, the display device 10 may include a plurality of wirings. The wirings may include scan lines SCL, sensing lines SSL, data lines DTL, reference voltage lines RVL, and a first voltage wiring VDL. In some embodiments, although not illustrated in the drawing, the wirings may further include a second voltage wiring VSL.

The scan lines SCL and the sensing lines SSL may extend in a first direction DR1. The scan lines SCL and the sensing lines SSL may be connected to a scan driver SDR. The scan driver SDR may include a driving circuit. The scan driver SDR may be disposed in the non-display area NDA on an other side of the display area DPA in the first direction DR1, for example, on a left side of the display area DPA, but embodiments are not limited to this case. The scan driver SDR may be connected to a signal connection wiring CWL, and at least one end portion of the signal connection wiring CWL may form a pad WPD_CW in the non-display area NDA and may thus be connected to an external device.

The data lines DTL and the reference voltage lines RVL may extend in a second direction DR2 crossing the first direction DR1. The first voltage wiring VDL may include a portion extending in the second direction DR2. In some embodiments, the first voltage wiring VDL may further include a portion extending in the first direction DR1. Accordingly, the first voltage wiring VDL may have a mesh structure, but embodiments are not limited to this case. Although not illustrated in the drawing, the second voltage wiring VSL, like the first voltage wiring VDL, may include a portion extending in the second direction DR2 and a portion extending in the first direction DR1.

A wiring pad WPD may be disposed at least one end portion of each of the data lines DTL, the reference voltage lines RVL, and the first voltage wiring VDL. Each wiring pad WPD may be disposed in the non-display area NDA. In some embodiments, wiring pads WPD_DT (hereinafter, referred to as 'data pads') of the data lines DTL may be disposed in the non-display area NDA located on a second side (i.e., a lower side) of the display area DPA in the second direction DR2, and wiring pads WPD_RV (hereinafter, referred to as 'reference voltage pads') of the reference voltage lines RVL and a wiring pad WPD_VDD (hereinafter, referred to as a 'first power pad') of the first voltage wiring VDL may be disposed in the non-display area NDA located on a first side (i.e., an upper side) of the display area DPA in the second direction DR2. In another example, the data pads WPD_DT, the reference voltage pads WPD_RV, and the first power pad WPD_VDD may all be disposed in the same area, for example, in the non-display area NDA located on the upper side of the display area DPA. An external device may be mounted on the wiring pads WPD as described above. The external device may be mounted on the wiring pads WPD by an anisotropic conductive film, ultrasonic bonding, or the like.

Each pixel PX of the display device 10 includes a pixel driving circuit. The above-described wirings may transmit driving signals to each pixel driving circuit while passing through or around each pixel PX. The pixel driving circuit may include a transistor and a capacitor. The number of transistors and capacitors included in each pixel driving circuit can be variously modified. The pixel driving circuit will be described below as having a 3T1C structure including three transistors and one capacitor. However, the pixel driving circuit may also have various modified pixel structures such as a 2T1C structure, a 7T1C structure, and a 6T1C structure.

Figure 3:
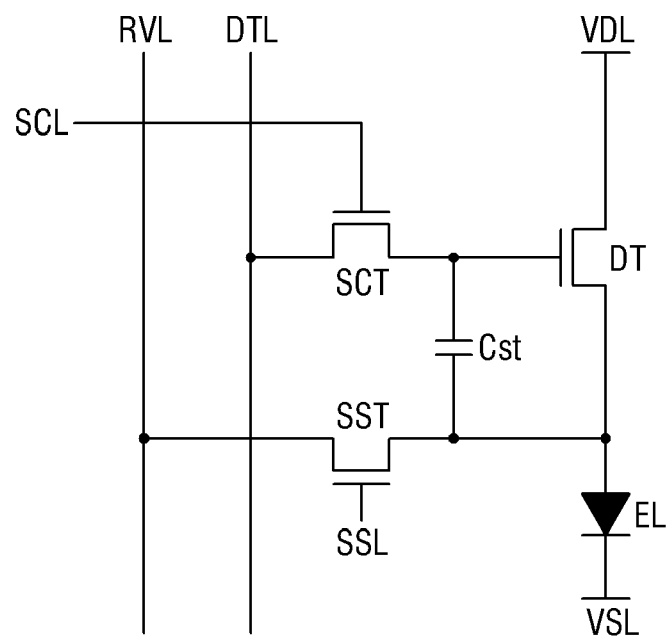
FIG. 3 is an equivalent circuit diagram of a pixel included in the display device, according to some embodiments of the present disclosure.

FIG. 3 is an equivalent circuit diagram of a pixel PX included in the display device 10 according to some embodiments of the present disclosure.

Referring to FIG. 3, each pixel PX of the display device 10 according to some embodiments includes three transistors DT, SCT, and SST and one storage capacitor Cst, in addition to an LED EL.

The LED EL emits light according to a current supplied through a driving transistor DT. The LED EL may include light emitting elements 300 (see FIG. 4) which generate light and a first electrode 210 (see FIG. 4) and a second electrode 220 (see FIG. 4) which are electrically connected to both ends of each of the light emitting elements 300 (see FIG. 4). This will be described in detail later.

The LED EL may have an end connected to a first source/drain electrode of the driving transistor DT and the other end connected to a second voltage wiring VSL to which a low-potential voltage (e.g., a second power supply voltage VSS) lower than a high-potential voltage (e.g., a first power supply voltage VDD) of a first voltage wiring VDL is supplied.

The driving transistor DT adjusts a current flowing from the first voltage wiring VDL, to which the first power supply voltage VDD is supplied, to the LED EL according to a voltage difference between a gate electrode and a source electrode of the driving transistor DT. The driving transistor DT may have the gate electrode connected to a first source/drain electrode of a scan transistor SCT, the first source/drain electrode connected to a first electrode of the LED EL, and a second source/drain electrode connected to the first voltage wiring VDL to which the first power supply voltage VDD is applied.

The scan transistor SCT may be turned on by a scan signal of a scan line SCL to connect a data line DTL to the gate electrode of the driving transistor DT. The scan transistor SCT may have a gate electrode connected to the scan line SCL, the first source/drain electrode connected to the gate electrode of the driving transistor DT, and a second source/drain electrode connected to the data line DTL.

A sensing transistor SST is turned on by a sensing signal of a sensing line SSL to connect a reference voltage line RVL to the first source/drain electrode of the driving transistor DT. The sensing transistor SST may have a gate electrode connected to the sensing line SSL, a first source/drain electrode connected to the reference voltage line RVL, and a second source/drain electrode connected to the first source/drain electrode of the driving transistor DT.

In some embodiments, the first source/drain electrode of each of the transistors DT, SCT, and SST may be a source electrode, and the second source/drain electrode may be a drain electrode. However, the opposite case may also be true.

The storage capacitor Cst is formed between the gate electrode and the first source/drain electrode of the driving transistor DT. The storage capacitor Cst stores a difference voltage between a gate voltage and a first source/drain voltage of the driving transistor DT.

Each of the transistors DT, SCT, and SST may be formed as a thin-film transistor. In some embodiments, although each of the transistors DT, SCT, and SST is described as an N-type metal oxide semiconductor field effect transistor (MOSFET) in FIG. 3, embodiments are not limited to this case. For example, each of the transistors DT, SCT, and SST may also be formed as a P-type MOSFET. In some embodiments, some of the transistors DT, SCT, and SST may be formed as N-type MOSFETs, and the others may be formed as P-type MOSFETs.

The structure of a pixel PX of the display device 10 according to example embodiments will now be described in detail with further reference to another drawing.

Figure 4:
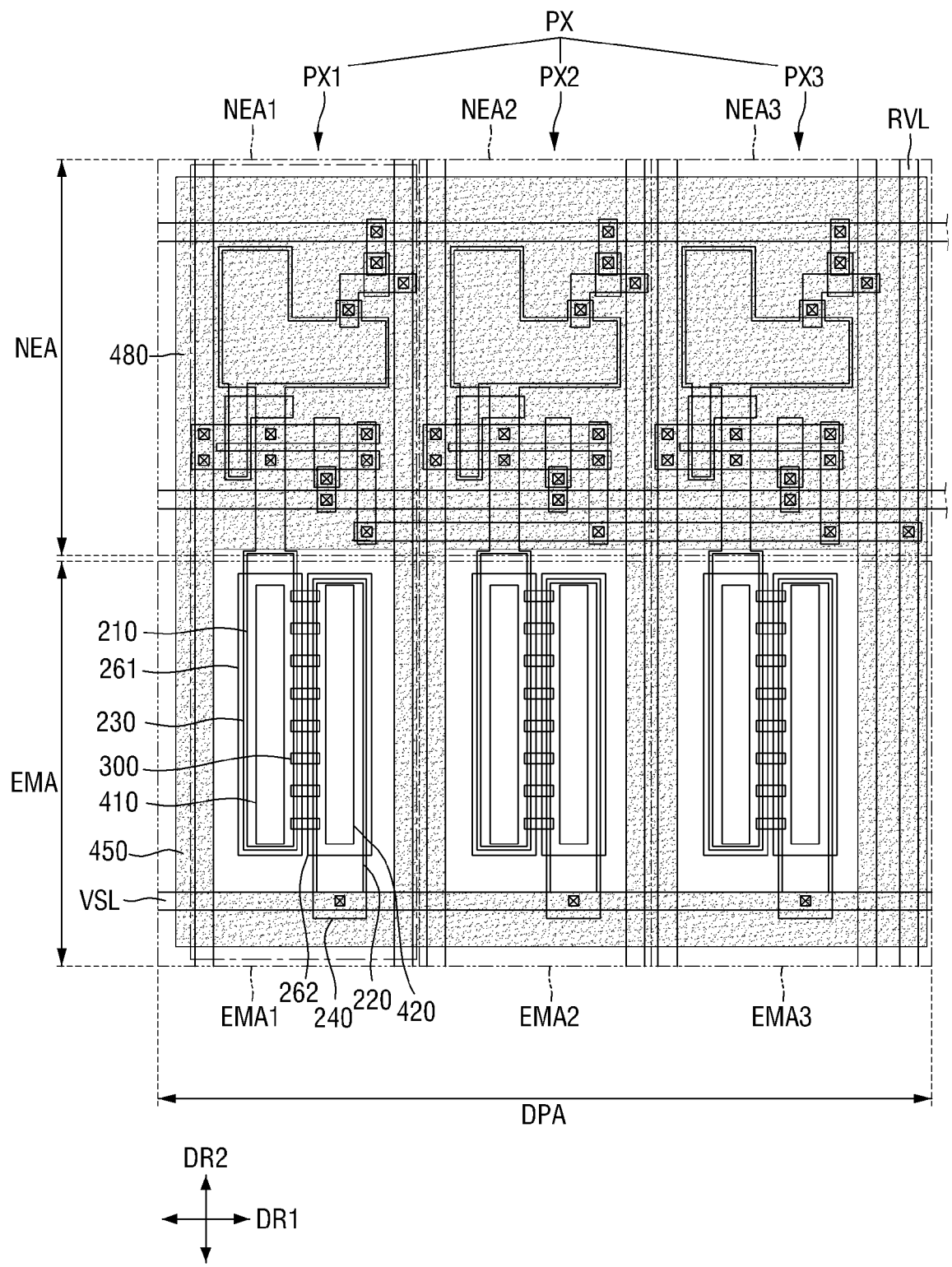
FIG. 4 is a layout view of a pixel of the display device, according to some embodiments of the present disclosure.

FIG. 4 is a layout view of a pixel PX of the display device 10, according to some embodiments of the present disclosure.

Referring to FIG. 4, each of the pixels PX may include a first subpixel PX1, a second subpixel PX2, and a third subpixel PX3. Each subpixel PXn may include one or more light emitting elements 300 to display light of a specific wavelength band. The light emitting elements 300 disposed in each subpixel PXn may include a different material from those disposed in other subpixels PXn to emit light of a different wavelength band. For example, the first subpixel PX may include light emitting elements 300 which emit light of a first color, the second subpixel PX2 may include light emitting elements 300 which emit light of a second color, and the third subpixel PX3 may include light emitting elements 300 which emit light of a third color. Accordingly, the light of the first color may be output from the first subpixel PX1, the light of the second color may be output from the second subpixel PX2, and the light of the third color may be output from the third subpixel PX3. In some embodiments, the light of the first color may be blue light whose central wavelength band is in the range of 450 nm to 495 nm, the light of the second color may be green light whose central wavelength band is in the range of 495 nm to 570 nm, and the light of the third color may be red light whose central wavelength band is in the range of 620 nm to 752 nm.

In some cases, the first subpixel PX1, the second subpixel PX2, and the third subpixel PX3 may include the same type of light emitting elements 300 to emit light of substantially the same color. Although one pixel PX includes three subpixels PXn in FIG. 4, embodiments are not limited to this case, and the pixel PX may also include more subpixels PXn.

In some embodiments, each pixel PX of the display device 10 may include an emission area EMA and a non-emission area NEA. The first subpixel PX1 may include a first emission area EMA1 and a first non-emission area NEA1, the second subpixel PX2 may include a second emission area EMA2 and a second non-emission area NEA2, and the third subpixel PX3 may include a third emission area EMA3 and a third non-emission area NEA3. The emission area EMA may be defined as an area where light emitted from the light emitting elements 300 disposed in each pixel PX is output. As described above, the light emitting elements 300 may emit light of a specific wavelength band in any direction. Light emitted from each light emitting element 300 may be radiated not only toward both ends of the light emitting element 300 but also in a lateral direction of the light emitting element 300. Accordingly, the emission area EMA of each subpixel PXn may include an area where the light emitting elements 300 are disposed and an area adjacent to the light emitting elements 300 where light from the light emitting elements 300 is output to. However, embodiments are not limited to this case, and the emission area EMA may also include an area where light emitted from the light emitting elements 300 is output after being reflected or refracted by other members.

Each pixel PX or subpixel PXn may include a pixel driving circuit, and the pixel driving circuit may be disposed in the non-emission area NEA of each pixel PX or subpixel PXn. For example, the non-emission area NEA may be an area where circuit elements constituting the pixel driving circuit of each pixel PX or subpixel PXn or a plurality of wirings are disposed. In some embodiments, the non-emission area NEA may be an area other than the emission area EMA and an area from which no light is emitted because light emitted from the light emitting elements 300 does not reach (or arrive at) this area. In the display device 10 according to some embodiments, the light emitting elements 300 emitting light and circuit elements for driving the light emitting elements 300 may be disposed in different areas, for example, in the emission area EMA and the non-emission are NEA and may not overlap each other in a thickness direction. Therefore, the display device 10 can output light through an upper surface or a rear surface of the area where the light emitting elements 300 are disposed. Further, as will be described later, electrodes 210 and 220 and base layers 230 and 240 electrically connected to the light emitting elements 300 may be formed in the same process as the circuit elements or wirings of the non-emission area NEA. Accordingly, the number of manufacturing processes of the display device 10 can be reduced.

The arrangement of elements included in each pixel PX or subpixel PXn will now be described with further reference to other drawings.

Figure 5:
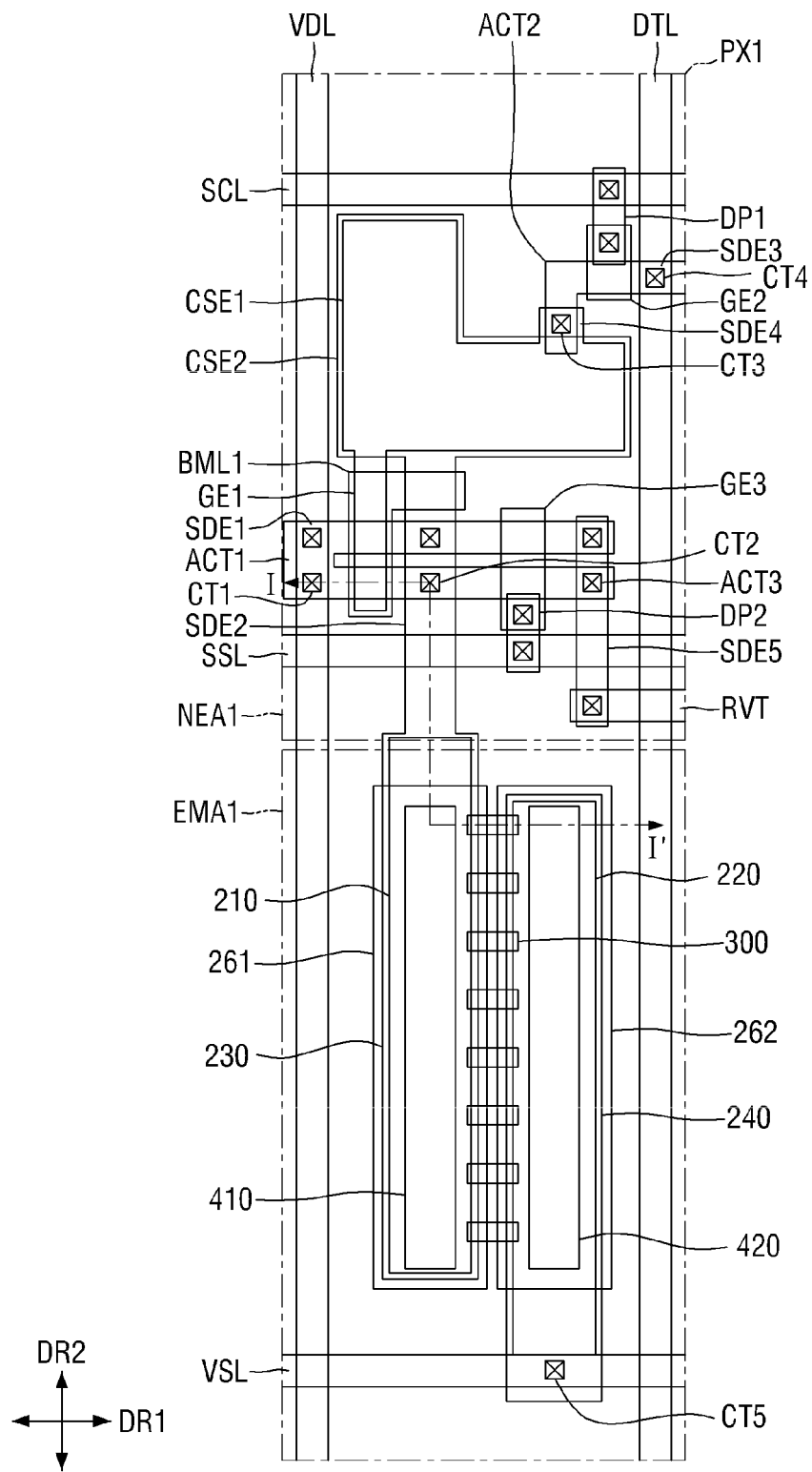
FIG. 5 is a layout view of a subpixel of FIG. 4, according to some embodiments of the present disclosure.
Figure 6:
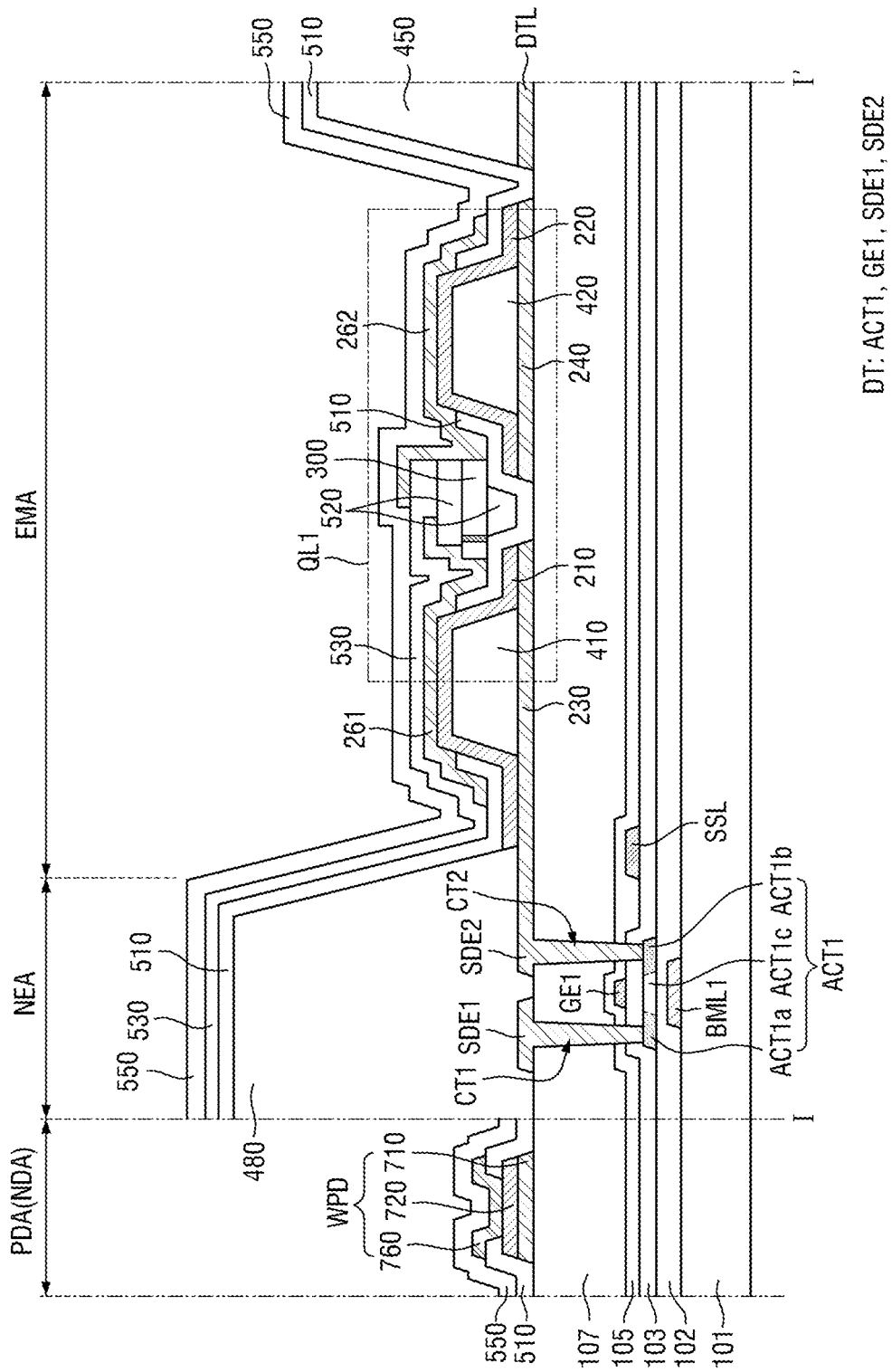
FIG. 6 is a cross-sectional view taken along the line I-I' of FIG. 5 and a portion of a non-display area, according to some embodiments of the present disclosure.

FIG. 5 is a layout view of a subpixel PXn of FIG. 4, according to some embodiments of the present disclosure. FIG. 6 is a cross-sectional view taken along the line I-I' of FIG. 5 and a portion of the non-display area NDA, according to some embodiments of the present disclosure.

For ease of description, an outer bank 450 (see FIG. 4) and a first planarization layer 480 (see FIG. 4) disposed in each subpixel PXn is not illustrated in FIG. 5. The part I-I' of FIG. 6 is a partial cross section of the non-emission area NEA and the emission area EMA of each subpixel PXn, and a cross section across an end and the other end portion of a light emitting element 300 is illustrated in FIG. 6. In some embodiments, FIG. 6 illustrates a pad area PDA where a plurality of wiring pads WPD are disposed in the non-display area NDA.

Referring to FIGS. 5 and 6 in addition to FIG. 4, each pixel PX or subpixel PXn of the display device 10 may include a first substrate 101 and a semiconductor layer, a plurality of conductive layers, and a plurality of insulating layers disposed on the first substrate 101. The conductive layers may include a first gate conductive layer, a first data conductive layer, electrodes and contact electrodes, and the insulating layers may include a buffer layer 102, a first gate insulating layer 103, a first protective layer 105, a first interlayer insulating layer 107, the first planarization layer 480, a first insulating layer 510, a second insulating layer 520, a third insulating layer 530, and a fourth insulating layer 550. The conductive layers and the semiconductor layer may constitute the transistors DT, SCT, and SST, the storage capacitor Cst, and a plurality of signal lines or voltage lines of each pixel PX described above with reference to FIG. 3. FIG. 6 illustrates a cross section of only the driving transistor DT among circuit elements disposed in the non-emission area NEA. A description of other transistors of each subpixel PXn, for example, the scan transistor SCT and the sensing transistor SST will not be provided in detail, as a person of ordinary skill in the art will be able to describe such elements from the details provided in other parts of this disclosure.

First, the first substrate 101 may be an insulating substrate. The first substrate 101 may be made of an insulating material such as glass, quartz, or polymer resin. In some embodiments, the first substrate 101 may be a rigid substrate, but may also be a flexible substrate that can be bent, folded, and/or rolled. The emission area EMA and the non-emission area NEA may be defined in the first substrate 101. The light emitting elements 300 may be disposed on the emission area EMA of the first substrate 101, and the driving transistor DT and the like may be disposed on the non-emission area NEA as circuit elements.

A first light blocking layer BML1 may be disposed on the first substrate 101. The first light blocking layer BML1 may be disposed on the non-emission area NEA of the first substrate 101 and may be overlapped by a portion of a first active material layer ACT1 of the driving transistor DT which will be described later. The first light blocking layer BML1 may include a light blocking material to prevent light from (or reduce the amount of light) entering the first active material layer ACT1. For example, the first light blocking layer BML1 may be made of an opaque metal material that blocks transmission of light. In some cases, the first light blocking layer BML1 may be omitted.

The buffer layer 102 is disposed on the first substrate 101 having the first light blocking layer BML1. The buffer layer 102 may be entirely disposed on the non-emission area NEA, the emission area EMA, and the non-display area NDA of the first substrate 101. The buffer layer 102 may be formed on the first substrate 101 to protect the transistors DT, SCT, and SST of each subpixel PXn from moisture introduced through the first substrate 101 which may be vulnerable to moisture penetration and may also perform a surface planarization function. The buffer layer 102 may be composed of a plurality of inorganic layers stacked alternately. For example, the buffer layer 102 may be formed as a multilayer in which one or more inorganic layers selected from a silicon oxide (SiOx) layer, a silicon nitride (SiNx) layer, and silicon oxynitride (SiON) are alternately stacked.

The semiconductor layer is disposed on the buffer layer 102. The semiconductor layer may be disposed in the non-emission area NEA of each pixel PX or subpixel PXn to include an active material layer of each transistor DT, SCT, or SST. The semiconductor layer may include the first active material layer ACT1 of the driving transistor DT, a second active material layer ACT2 of the scan transistor SCT, and a third active material layer ACT3 of the sensing transistor SST.

The semiconductor layer may be partially overlapped by gate electrodes GE1 through GE3 of the first gate conductive layer which will be described later. In the drawings, the second active material layer ACT2 may be disposed on a first side (i.e., an upper side) of a center of the non-emission area NEA of each subpixel PXn in the second direction DR2, and the first active material layer ACT1 and the third active material layer ACT3 may be disposed on a second side (i.e., a lower side) of the center of the non-emission area NEA in the second direction DR2. As illustrated in the drawings, the first active material layer ACT1 of the driving transistor DT and the third active material layer ACT3 of the sensing transistor SST may be integrated into one semiconductor layer. A portion of the semiconductor layer may be the first active material layer ACT1, and another portion of the semiconductor layer may be the third active material layer ACT3.

In some example embodiments, the semiconductor layer may include polycrystalline silicon, monocrystalline silicon, an oxide semiconductor, or the like. When the semiconductor layer includes polycrystalline silicon, the first active material layer ACT1 may include a first doping region ACT1a, a second doping region ACT1b, and a first channel region ACT1c. The first doping region ACT1a and the second doping region ACT1b may be regions doped with impurities. The first channel region ACT1c may be disposed between the first doping region ACT1a and the second doping region ACT1b. The polycrystalline silicon may be formed by crystalizing amorphous silicon. Non-limiting examples of the crystallization method include rapid thermal annealing (RTA), solid phase crystallization (SPC), excimer laser annealing (ELA), metal induced crystallization (MIC), and sequential lateral solidification (SLS). In some embodiments, the first active material layer ACT1 may include monocrystalline silicon, low-temperature polycrystalline silicon, amorphous silicon, or the like.

The first active material layer ACT1 is not necessarily limited to the above examples. In some example embodiments, the first active material layer ACT1 may include an oxide semiconductor. In some embodiments, the doping regions may be conducting regions. When the first active material layer ACT1 includes an oxide semiconductor, the oxide semiconductor may be an oxide semiconductor containing indium (In). In some embodiments, the oxide semiconductor may be indium-tin oxide (ITO), indium-zinc oxide (IZO), indium-gallium oxide (IGO), indium-zinc-tin oxide (IZTO), indium-gallium-tin oxide (IGTO), or indium-gallium-zinc-tin oxide (IGZTO).

The first gate insulating layer 103 is disposed on the semiconductor layer and the buffer layer 102. The first gate insulating layer 103 may be disposed on the buffer layer 102 having the semiconductor layer, for example, the first through third active material layers ACT1 through ACT3. For example, the first gate insulating layer 103 may be entirely disposed on the non-emission area NEA, the emission area EMA, and the non-display area NDA. The first gate insulating layer 103 may function as a gate insulating film of each transistor DT, SCT, or SST. The first gate insulating layer 103 may be made of an inorganic material such as silicon oxide (SiOx), silicon nitride (SiNx), or a stack of the same.

The first gate conductive layer is disposed on the first gate insulating layer 103. The first gate conductive layer may include the respective gate electrodes GE1, GE2 and GE3 of the transistors DT, SCT, and SST, a scan line SCL, a sensing line SSL, a second voltage wiring VSL, a reference voltage distribution line RVT, and a first capacitive electrode CSE1 of the storage capacitor Cst disposed in the non-emission area NEA.

First, the respective gate electrodes GE1, GE2, and GE3 of the transistors DT, SCT, and SST may overlap the first, second and third active material layers ACT1, ACT2, and ACT3, respectively. A first gate electrode GE1 may overlap at least a portion of the first active material layer ACT1, a second gate electrode GE2 may overlap at least a portion of the second active material layer ACT2, and a third gate electrode GE3 may overlap at least a portion of the third active material layer ACT3. The first gate electrode GE1 may be electrically connected to the first capacitive electrode CSE1 of the storage capacitor Cst to be described later. The second gate electrode GE2 may be electrically connected to the scan line SCL to be described later, and the third gate electrode GE3 may be electrically connected to the sensing line SSL to be described later.

The scan line SCL may extend in the first direction DR1 beyond boundaries of neighboring subpixels PXn. For example, a plurality of pixels PX or subpixels PXn neighboring each other in the first direction DR1 may share one scan line SCL. The scan line SCL may be disposed on the first side (i.e., the upper side) of the center of the non-emission area NEA of each subpixel PXn in the second direction DR2. The scan line SCL may be electrically connected to the second gate electrode GE2 of the scan transistor SCT through a portion of the first data conductive layer to be described later and may transmit a scan signal to the scan transistor SCT.

The sensing line SSL may also extend in the first direction DR1 beyond the boundaries of the neighboring subpixels PXn. For example, a plurality of pixels PX or subpixels PXn neighboring each other in the first direction DR1 may share one sensing line SSL. The sensing line SSL may be disposed on the second side (i.e., the lower side) of the center of the non-emission area NEA of each subpixel PXn in the second direction DR2. The sensing line SSL may be electrically connected to the third gate electrode GE3 of the sensing transistor SST through a portion of the first data conductive layer to be described later and may transmit a sensing signal to the sensing transistor SST.

The reference voltage distribution line RVT may be disposed on a second side of the sensing line SSL in the second direction DR2 and may extend in the first direction DR1. The reference voltage distribution line RVT may extend from the first subpixel PX1 to the third subpixel PX3, and each pixel PX, for example, three subpixels PXn may share one reference voltage distribution line RVT. The reference voltage distribution line RVT may be electrically connected to a reference voltage line RVL to be described later and a first source/drain electrode of the sensing transistor SST of each subpixel PXn. Therefore, the reference voltage distribution line RVT may transfer a reference voltage received from the reference voltage line RVL to the sensing transistor SST.

The second voltage wiring VSL may be disposed on a side of the emission area EMA and may extend in the first direction DR1. For example, the second voltage wiring VSL may be disposed on a second side (i.e., a lower side) of the emission area EMA in the second direction DR2 and located opposite the non-emission area NEA with respect to a center of each subpixel PXn. However, because a plurality of pixels PX or subpixels PXn may be arranged along the first direction DR1 and the second direction DR2, the second voltage wiring VSL may be located at a boundary between subpixels PXn neighboring each other in the second direction DR2. In some embodiments, the second voltage wiring VSL may further include a portion which is disposed in the non-display area NDA of the display device 10 and extends in the second direction DR2. The portion of the second voltage wiring VSL which extends in the second direction DR2 may be connected to the wiring pads WPD described above and thus receive the second power supply voltage VSS. The second voltage wiring VSL may be electrically connected to the second electrode 220 to be described later and apply the second power supply voltage VSS to the light emitting elements 300. In FIG. 5, the second voltage wiring VSL and the second electrode 220 are connected in each subpixel PXn. However, embodiments are not limited to this case. In some cases, the second electrodes 220 of a plurality of subpixels PXn may be connected to form a single electrode and then electrically connected to the second voltage wiring VSL located in the non-display area NDA.

The first capacitive electrode CSE1 of the storage capacitor Cst is disposed between the scan line SCL and the sensing line SSL. The first capacitive electrode CSE1 of the storage capacitor Cst may be electrically connected to the first gate electrode GE1 of the driving transistor DT and a second source/drain electrode SDE4 of the scan transistor SCT.

The second source/drain electrode SDE4 of the scan transistor SCT may contact a side of the second active material layer ACT2 through a third contact hole CT3 in an area overlapping the side of the second active material layer ACT2. The second source/drain electrode SDE4 may be connected to the first capacitive electrode CSE1 of the storage capacitor Cst.

The first gate conductive layer may be, but is not limited to, a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

The first protective layer 105 is disposed on the first gate conductive layer. The first protective layer 105 may be entirely disposed in the non-emission area NEA, the emission area EMA, and the non-display area NDA to cover the active material layers ACT1, ACT2, and ACT3 of the transistors DT, SCT, and SST and a plurality of signal lines. The first protective layer 105 may be made of an inorganic material such as silicon oxide (SiOx), silicon nitride (SiNx), or a stack of the same.

The first interlayer insulating layer 107 is disposed on the first protective layer 105. The first interlayer insulating layer 107 may compensate for steps formed by conductive layers disposed under the first interlayer insulating layer 107 while functioning as an insulating film between the first gate conductive layer and other layers disposed on the first gate conductive layer. The first interlayer insulating layer 107 may be made of an inorganic material such as silicon oxide (SiOx), silicon nitride (SiNx), or a stack of the same.

Although only one first interlayer insulating layer 107 is disposed between the first gate conductive layer and the first data conductive layer in the drawings, embodiments are not limited to this case. According to some embodiments, another conductive layer may be further disposed between the first gate conductive layer and the first data conductive layer, and more interlayer insulating layers may be disposed to insulate the conductive layers. This will be described with reference to some example embodiments.

The first data conductive layer is disposed on the first interlayer insulating layer 107. The first data conductive layer may include a data line DTL, a first voltage wiring VDL, the reference voltage line RVL, respective first source/drain electrodes SDE1, SDE3, and SDE5 and second source/drain electrode SDE2 and SDE4 of the transistors DT, SCT, and SST, a plurality of conductive patterns DP1 and DP2, and a second capacitive electrode CSE2 of the storage capacitor Cst disposed in the non-emission area NEA. In some embodiments, the first data conductive layer may include electrode base layers 230 and 240 disposed in the emission area EMA and a pad base layer 710 disposed in the pad area PDA.

As described above, in the display device 10 according to some embodiments, the emission area EMA and the non-emission area NEA of each pixel PX or subpixel PXn may be separated, and members disposed in the emission area EMA and members disposed in the non-emission area NEA may not overlap in the thickness direction. Accordingly, conductive layers or insulating layers disposed in the emission area EMA, the non-emission area NEA, and also the non-display area NDA can be formed concurrently (e.g., simultaneously) in the same process, and the number of manufacturing processes of the display device 10 can be reduced. According to some embodiments, in the display device 10, the electrode base layers 230 and 240 of the emission area EMA, the source/drain electrodes SDE1 through SDE5 of the transistors DT, SCT, and SST disposed in the non-emission area NEA, and the pad base layer 710 disposed in the non-display area NDA may be disposed at the same layer.

In some embodiments, the data line DTL may extend in the second direction DR2 beyond boundaries of neighboring subpixels PXn. For example, a plurality of pixels PX or subpixels PXn neighboring each other in the second direction DR2 may share one data line DTL. The data line DTL may be disposed on a first side (e.g., a right side) of the center of the non-emission area NEA of each subpixel PXn in the first direction DR1. The data line DTL may contact a side of the second active material layer ACT2 of the scan transistor SCT through a fourth contact hole CT4. For example, a portion of the data line DTL may be the first source/drain electrode SDE3 of the scan transistor SCT. Therefore, a data signal transmitted to the data line DTL may be transferred to the scan transistor SCT.

The first voltage wiring VDL may also extend in the second direction DR2 beyond the boundaries of the neighboring subpixels PXn. For example, a plurality of pixels PX or subpixels PXn neighboring each other in the second direction DR2 may share one first voltage wiring VDL. The first voltage wiring VDL may be disposed on a second side (i.e., a left side) of the center of the non-emission area NEA of each subpixel PX in the first direction DR1. The first voltage wiring VDL may contact a side of the first active material layer ACT1 of the driving transistor DT through a first contact hole CT1. For example, a portion of the first voltage distribution line VDL may be the first source/drain electrode SDE1 of the driving transistor DT. Therefore, the first power supply voltage VDD applied to the first voltage wiring VDL may be transferred to the driving transistor DT.

The first voltage wiring VDL and the data line DTL may be disposed in each subpixel PXn. As illustrated in the drawings, the first voltage wiring VDL and the data line DTL may be disposed on a left side and a right of the center of each subpixel PXn, respectively, and may extend in the second direction DR2 over the non-emission area NEA and the emission area EMA. The first voltage wiring VDL and the data line DTL disposed in the emission area EMA may be disposed under the outer bank 450 to be described later.

One reference voltage line RVL may be disposed in each pixel PX, for example, every three subpixels PXn. For example, the reference voltage line RVL may be disposed on a first side (i.e., a left side) of the data line DTL of each subpixel PXn in the first direction DR1 and may extend in the second direction DR2. A plurality of pixels PX neighboring each other in the second direction DR2 may share one reference voltage line RVL. The reference voltage line RVL may be electrically connected to the reference voltage distribution line RVT described above, and a reference voltage applied through the reference voltage line RVL may be transferred to the sensing transistor SST of each subpixel PXn through the reference voltage distribution line RVT.

The second capacitive electrode CSE2 of the storage capacitor Cst is disposed between the first voltage wring VDL and the data line DTL. The second capacitive electrode CSE2 of the storage capacitor Cst may overlap the first capacitive electrode CSE1, and the storage capacitor Cst may be formed between the first capacitive electrode CSE1 and the second capacitive electrode CSE2. The second capacitive electrode CSE2 of the storage capacitor Cst may be connected to the second source/drain electrode SDE2 of the driving transistor DT. The second source/drain electrode SDE2 of the driving transistor DT may contact a portion of the first active material layer ACT1 through a second contact hole CT2. In some embodiments, the second source/drain electrode SDE2 of the driving transistor DT may contact a side of the third active material layer ACT3 of the sensing transistor SST to form the second source/drain electrode of the sensing transistor SST.

The first source/drain electrode SDE5 of the sensing transistor SST may contact a side of the third active material layer ACT3 and the reference voltage distribution line RVT. The first source/drain electrode SDE5 of the sensing transistor SST may receive a reference voltage from the reference voltage distribution line RVT.

A first conductive pattern DP1 and a second conductive pattern DP2 of the first data conductive layer may be connected to portions of the first gate conductive layer. The first conductive pattern DP1 may be connected to the scan line SCL and the second gate electrode GE2 of the scan transistor SCT and transmit a scan signal received from the scan line SCL to the second gate electrode GE2 of the scan transistor SCT. The second conductive pattern DP2 may be connected to the sensing line SSL and the third gate electrode GE3 of the sensing transistor SST and transmit a sensing signal received from the sensing line SSL to the third gate electrode GE3 of the sensing transistor SST.

The display device 10 according to example embodiments may include a plurality of base layers. The base layers may include the electrode base layers 230 and 240 disposed in the emission area EMA and the pad base layer 710 disposed in the non-display area NDA. The base layers may be included in the first data conductive layer. For example, the electrode base layers 230 and 240 and the pad base layer 710 according to some embodiments may be disposed on the first interlayer insulating layer 107 to be at the same layer as the source/drain electrodes SDE1 and SDE2 of the driving transistor DT.

In some embodiments, the electrode base layers 230 and 240 are disposed on the first interlayer insulating layer 107 in the emission area EMA. The electrode base layers 230 and 240 may include a first electrode base layer 230 and a second electrode base layer 240. The first electrode base layer 230 and the second electrode base layer 240 may extend in a direction in the emission area EMA and may be spaced to face each other. For example, the first electrode base layer 230 and the second electrode base layer 240 may extend in the second direction DR2 and may be spaced from each other in the first direction DR1 with respect to a center of the emission area EMA. The first electrode base layer 230 and the second electrode base layer 240 may be spaced from each other, and inner banks 410 and 420 and the electrodes 210 and 220 may be disposed on the first electrode base layer 230 and the second electrode base layer 240, respectively, thereby providing a space in which the light emitting elements 300 are disposed.

In some embodiments, the first electrode base layer 230 and the second electrode base layer 240 may extend in the second direction DR2 but may end at positions spaced from at least the boundary of each subpixel PXn so as not to be disposed in another subpixel PXn neighboring in the second direction DR2. Accordingly, the first electrode base layer 230 and the second electrode base layer 240 may be disposed in each subpixel PXn to form linear patterns on the entire surface of the display deice 10.

However, the first electrode base layer 230 and the second electrode base layer 240 may extend to different lengths in the second direction DR2. The first electrode base layer 230 may extend in the second direction DR2 from the emission area EMA such that at least a portion of the first electrode base layer 230 is disposed in the non-emission area NEA. The second electrode base layer 240 may be spaced from the non-emission area NEA, and at least a portion of the second electrode base layer 240 may be disposed under the outer bank 450. Although one first electrode base layer 230 and one second electrode base layer 240 are disposed in each subpixel PXn in the drawings, embodiments are not limited to this case. In some embodiments, more than one first electrode base layers 230 and more than one second electrode base layers 240 may be disposed, and some of them may be connected to each other.

The first electrode base layer 230 and the second electrode base layer 240 may be disposed at the same layer as circuit elements or wirings disposed in each subpixel PXn and may be electrically connected to the circuit elements or wirings. As described above, the electrode base layers 230 and 240 may be directly disposed on the first interlayer insulating layer 107 and may be included in the first data conductive layer. The light emitting elements 300 that emit light and a circuit element, for example, the driving transistor DT for driving the light emitting elements 300 may be disposed not to overlap each other in the thickness direction, and layers disposed in the emission area EMA and the non-emission area NEA of the display device 10 may be formed in the same process. Therefore, the number of manufacturing processes can be reduced. In some embodiments, because the light emitting elements 300 do not overlap the circuit elements in the thickness direction, light emitted from the light emitting elements 300 may output toward above or below the first substrate 101.

The first electrode base layer 230 and the second electrode base layer 240 may be electrically connected to the first electrode 210 and the second electrode 220, respectively, and the first electrode 210 and the second electrode 220 may receive electrical signals through the electrode base layers 230 and 240, respectively.

According to some embodiments, the first electrode base layer 230 may be directly connected to a source/drain electrode of the driving transistor DT. For example, the first electrode base layer 230 may extend in the second direction DR2 and may be connected to the second source/drain electrode SDE2 of the driving transistor DT. For example, the first electrode base layer 230 may form a pattern substantially integrated with the second source/drain electrode SDE2 of the driving transistor DT. While the display device 10 is being driven, an electrical signal transmitted from the driving transistor DT may be transmitted to the first electrode 210, to be described later, through the first electrode base layer 230.

The second electrode base layer 240 may be electrically connected to the second voltage wiring VSL disposed under the outer bank 450 in an area overlapping the outer bank 450 to be described later. For example, the second electrode base layer 240 may be connected to the second voltage wiring VSL through a fifth contact hole CT5 penetrating the first interlayer insulating layer 107 in the area overlapping the outer bank 450. While the display device 10 is being driven, the second power supply voltage VSS applied to the second voltage wiring VSL may be applied to the second electrode 220 through the second electrode base layer 240.

However, embodiments are not limited to this example. The first electrode base layer 230 and the second electrode base layer 240 may not necessarily be connected to the driving transistor DT or the second voltage wiring VSL as illustrated in FIGS. 5 and 6. In some embodiments, the electrode base layers 230 and 240 may be electrically connected to circuit elements or wirings through bridge patterns and, in some cases, the first electrode 210 and the second electrode 220 may be directly electrically connected to the circuit elements or wirings.

A plurality of wiring pads WPD may be disposed in the pad area PDA of the non-display area NDA, and each of the wiring pads WPD may include the pad base layer 710 included in the first data conductive layer. The pad base layer 710 may be disposed directly on the first interlayer insulating layer 107 in the pad area PDA. In the display device 10, because the base electrode layers 230 and 240 of the emission area EMA, the source/drain electrodes and voltage wirings of the non-emission area NEA, and the pad base layer 710 of the pad area PDA are formed in the same process, the number of manufacturing processes can be reduced. The electrode base layers 230 and 240 and the pad base layer 710 included in the first data conductive layer may be formed by placing a conductive layer on the entire surface of the first interlayer insulating layer 107 and then concurrently (e.g., simultaneously) patterning the conductive layer together with members disposed on the conductive layer. In some example embodiments, a portion of the first data conductive layer may form substantially the same pattern as an element disposed on the portion. This will be described later.

A via layer is disposed on the first data conductive layer. The via layer may include the first planarization layer 480 disposed in the non-emission area NEA and the inner banks 410 and 420 and the outer bank 450 disposed in the emission area EMA. In the display device 10 according to the example embodiments, because elements of the via layer disposed on the first data conductive layer are formed together in the same process, the number of manufacturing processes can be reduced. However, the elements of the via layer may be formed to have different heights as illustrated in the drawings.

In some embodiments, the first planarization layer 480 may cover the entire non-emission area NEA including the first data conductive layer of the non-emission area NEA. The first planarization layer 480 may protect the first data conductive layer while planarizing steps formed by circuit elements disposed in the non-emission area NEA.

The outer bank 450 may be disposed in a portion of the emission area EMA and may be formed in the same process as the first planarization layer 480 of the non-emission area NEA. However, as illustrated in FIG. 4, the first planarization layer 480 may cover the entire non-emission area NEA, but the outer bank 450 may expose a portion of the emission area EMA.

For example, the outer bank 450 (e.g., see FIG. 4) may be disposed at the boundary between the subpixels PXn. The outer bank 450 may extend in the first direction DR1 and the second direction DR2 and surround the electrode base layers 230 and 240, the inner banks 410 and 420 and also the electrodes 210 and 220 as well as an area where the light emitting elements 300 are disposed between the electrode base layers 230 and 240 and between the inner banks 410 and 420. For example, the outer bank 450 may form a grid pattern on the entire surface of the display area DPA.

A portion of the outer bank 450 which extends in the first direction DR1 may be disposed on the second voltage wiring VSL, and portions of the outer bank 450 which extend in the second direction DR2 may be disposed on the first voltage wiring VDL and the data line DTL of the first data conductive layer. In some embodiments, the outer bank 450 may be directly disposed on the first data conductive layer, and a portion of the outer bank 450 may be directly disposed on the data line DTL or the first voltage wiring VDL.

During the manufacturing process of the display device 10, the first data conductive layer disposed in the emission area EMA may be patterned in the same process as the electrodes 210 and 220. Here, the first data conductive layer on which the electrodes 210 and 220 are not disposed may be patterned along the shape of the via layer, for example, the outer bank 450 disposed on the first data conductive layer. As illustrated in FIG. 6, the data line DTL disposed under the outer bank 450 may be patterned along the shape of the outer bank 450, and a side surface of the data line DTL may be at the same plane as a side surface of the outer bank 450. For example, according to some embodiments, at least one side surface of the data line DTL may not contact the outer bank 450. Accordingly, the side surface of the data line DTL may be exposed and may directly contact the first insulating layer 510 to be described later.

In some embodiments, the outer bank 450 may be formed higher than the inner banks 410 and 420 to separate neighboring subpixels PXn. In some embodiments, during the manufacturing process of the display device 10, the outer bank 450 may prevent the ink from (or reduce the chance of ink) overflowing to adjacent subpixels PXn in an inkjet process for placing the light emitting elements 300, as will be described later.

The inner banks 410 and 420 are respectively disposed on the electrode base layers 230 and 240 disposed in the emission area EMA. For example, the inner banks 410 and 420 may include a first inner bank 410 and a second inner bank 420. The first inner bank 410 may be directly disposed on the first electrode base layer 230, and the second inner bank 420 may be directly disposed on the second electrode base layer 240. The first inner bank 410 and the second inner bank 420 may extend in the second direction DR2 in the emission area EMA of each subpixel PXn and may be spaced to face each other in the first direction DR1. The inner banks 410 and 420 may be spaced from the boundary of each subpixel PXn so as not to extend to a neighboring subpixel PXn and may form patterns on the entire surface of the display device 10. In some embodiments, the inner banks 410 and 420 may be spaced from each other, and the area where the light emitting elements 300 are disposed may be formed between the inner banks 410 and 420.

The inner banks 410 and 420 may be formed to have a smaller size than the electrode base layers 230 and 240. In some embodiments, widths of the inner banks 410 and 420 measured in a direction, for example, in the first direction DR1 may be smaller than widths of the electrode base layers 230 and 240 measured in the direction. As illustrated in FIG. 6, both side surfaces of the inner banks 410 and 420 may be recessed from both side surfaces of the electrode base layers 230 and 240 to partially expose upper surfaces of the electrode base layers 230 and 240. The electrodes 210 and 220 are disposed on the exposed upper surfaces of the electrode base layers 230 and 240, respectively. In some embodiments, lengths to which the inner banks 410 and 420 extend in the second direction DR2 may be smaller than lengths to which the electrode base layers 230 and 240 extend in the second direction DR2. For example, the inner banks 410 and 420 may be disposed only on the electrode base layers 230 and 240.

Although one first inner bank 410 and one second inner bank 420 are illustrated in the drawings, embodiments are not limited to this case. In some cases, more inner banks 410 and 420 may be disposed according to the number of the electrodes 210 and 220 to be described later.

In some embodiments, at least a portion of each of the first inner bank 410 and the second inner bank 420 may protrude from the upper surface of the electrode base layer 230 or 240. The protruding portions of the first inner bank 410 and the second inner bank 420 may have inclined side surfaces, and light emitted from the light emitting elements 300 disposed between the first inner bank 410 and the second inner bank 420 may emit to the inclined side surfaces of the inner banks 410 and 420. As will be described later, the electrodes 210 and 220 disposed on the inner banks 410 and 420 may include a material having high reflectivity, and light emitted from the light emitting elements 300 may be reflected by the side surfaces of the inner banks 410 and 420 to travel in an upward direction with respect to the first substrate 101. For example, the inner banks 410 and 420 may provide an area where the light emitting elements 300 are disposed while functioning as reflective barriers that reflect light emitted from the light emitting elements 300 in an upward direction.

As described above, in the display device 10 according to example embodiments, the first planarization layer 480, the inner banks 410 and 420 and the outer bank 450 of the via layer may have different heights. The first planarization layer 480, the inner banks 410 and 420, and the outer bank 450 may be concurrently (e.g., simultaneously) formed in the same process during the manufacturing process of the display device 10 but may be formed to have different heights according to their positions and functions. This will be described in detail later with reference to other drawings.

A plurality of electrodes 210 and 220 may be disposed on the first data conductive layer of the emission area EMA. In some embodiments, a pad electrode 720 may be disposed on the first data conductive layer, for example, the pad base layer 710 of the non-display area NDA or the pad area PDA. The display device 10 according to the example embodiments may include the first electrode 210 disposed on the first electrode base layer 230 and the second electrode 220 disposed on the second electrode base layer 240 and may further include the pad electrode 720 disposed on the pad base layer 710.

The first electrode 210 is disposed on the first electrode base layer 230. As illustrated in FIG. 5, the first electrode 210 may extend in the second direction DR2 in the emission area EMA of each subpixel PXn. The first electrode 210 may not extend to another subpixel PXn neighboring in the second direction DR2 and may be spaced from the outer bank 450 surrounding the emission area EMA of each subpixel PXn. The first electrode 210 may partially contact the first planarization layer 480 of the non-emission area NEA, but embodiments are not limited to this example.

The first electrode 210 may be formed in substantially the same pattern as the first electrode base layer 230. According to some embodiments, a side surface of at least one end portion of the first electrode base layer 230 may be at the same line as a side surface of an end portion of the first electrode 210. For example, a side surface of an end portion of the first electrode base layer 230 in the first direction DR1 and a side surface of an end portion of the first electrode 210 in the first direction DR1 may be at the same line while forming a flat surface.

The first electrode 210 and the first electrode base layer 230 may be formed by patterning portions of a conductive layer disposed on the entire surface of the first interlayer insulating layer 107 in the same process during the manufacturing process of the display device 10. Accordingly, the first electrode 210 may have a pattern similar to that of the first electrode base layer 230. In some embodiments, a width of the first electrode 210 measured in a direction, for example, in the first direction DR1 may be substantially the same as the width of the first electrode base layer 230 measured in the first direction DR1. However, a portion of the first electrode base layer 230 may be disposed in the non-emission area NEA, and the first electrode 210 may not be disposed on that portion.

The first electrode 210 may be electrically connected to a source/drain electrode of the driving transistor DT. For example, as illustrated in the drawings, the first electrode base layer 230 may be directly connected to the second source/drain electrode SDE2 of the driving transistor DT, and the first electrode 210 may be electrically connected to the driving transistor DT through the first electrode base layer 230. However, embodiments are not limited to this example. In some embodiments, the first electrode 210 may be directly connected to a sources/drain electrode of the driving transistor DT.

The second electrode 220 is disposed on the second electrode base layer 240. As illustrated in FIG. 5, the second electrode 220 may extend in the second direction DR2 in the emission area EMA of each subpixel PXn. The second electrode 220 may not extend to another subpixel PXn neighboring in the second direction DR2 and may be spaced from the outer bank 450 surrounding the emission area EMA of each subpixel PXn. However, the second electrode 220 may partially contact the outer bank 450 extending in the first direction DR1, but embodiments are not limited to this example.

The second electrode 220 may be electrically connected to the second voltage wiring VSL. For example, the second electrode base layer 240 may be connected to the second voltage wiring VSL through the fifth contact hole CT5 at a position overlapping the outer bank 450 extending in the first direction DR1, and the second electrode 220 may be electrically connected to the second voltage wiring VSL through the second electrode base layer 240. The second electrode 220 may be electrically connected to the second voltage wiring VSL in each pixel PX or subpixel PXn. However, embodiments are not limited to this example. In some embodiments, a wiring extending in a direction and connected to the second electrodes 220 of a plurality of pixels PX or subpixels PXn may be electrically connected to the second voltage wiring VSL on the periphery of the display area DPA, and the second electrode 220 may be electrically connected to the second voltage wiring VSL through the wiring.

The second electrode 220 may be formed in substantially the same pattern as the second electrode base layer 240. Like the first electrode 210 and the first electrode base layer 230, a side surface of at least one end portion of the second electrode base layer 240 may be at the same line as a side surface of an end portion of the second electrode 220 according to some embodiments. For example, a side surface of an end portion of the second electrode base layer 240 in the first direction DR1 and a side surface of an end portion of the second electrode 220 in the first direction DR1 may be at the same line while forming a flat surface. In some embodiments, a width of the second electrode 220 measured in the first direction DR1 may be substantially the same as the width of the second electrode base layer 240 measured in the first direction DR1. However, a portion of the second electrode base layer 240 may be disposed under the outer bank 450, and the second electrode 220 may not be disposed on that portion.

The first electrode 210 and the second electrode 220 may be disposed adjacent to the center of the emission area EMA and may be spaced from each other. A plurality of light emitting elements 300 may be disposed between the first electrode 210 and the second electrode 220, and the electrodes 210 and 220 may be electrically connected to the light emitting elements 300 and may receive a predetermined (e.g., set) voltage so that the light emitting elements 300 can emit light. For example, the electrodes 210 and 220 may be electrically connected to the light emitting elements 300 through contact electrodes 261 and 262 to be described later and may transmit received electrical signals to the light emitting elements 300 through the contact electrodes 261 and 262. In some embodiments, at least a portion of each of the electrodes 210 and 220 may be utilized to form an electric field in each subpixel PXn so as to align the light emitting elements 300.

In some example embodiments, the first electrode 210 may be separated in each subpixel PXn, and the second electrode 220 may be connected along each subpixel PXn. Any one of the first electrode 210 and the second electrode 220 may be electrically connected to an anode electrode of the light emitting elements 300, and the other may be electrically connected to a cathode electrode of the light emitting elements 300. However, embodiments are not limited to this case, and the opposite case may also be true.

Each of the electrodes 210 and 220 may include a transparent conductive material. For example, each of the electrodes 210 and 220 may include a material such as indium-tin oxide (ITO), indium-zinc oxide (IZO), or indium-tin-zinc oxide (ITZO). In some embodiments, each of the electrodes 210 and 220 may include a conductive material having high reflectivity. For example, each of the electrodes 210 and 220 may include a metal such as silver (Ag), copper (Cu) or aluminum (Al) as a material having high reflectivity. In some embodiments, each of the electrodes 210 and 220 may reflect incident light toward an upward direction in each subpixel PXn.

In some embodiments, each of the electrodes 210 and 220 may have a structure in which a transparent conductive material and a metal layer having high reflectivity are each stacked in one or more layers or may be formed as a single layer including the transparent conductive material and the metal layer. In some example embodiments, each of the electrodes 210 and 220 may have a stacked structure of ITO/Ag/ITO/IZO or may be an alloy containing aluminum (Al), nickel (Ni), lanthanum (La), or the like.

Although one first electrode 210 and one second electrode 220 are disposed in each subpixel PXn in the drawings, embodiments are not limited to this case. Like the electrode base layers 230 and 240 and the inner banks 410 and 420, more first electrodes 210 and more second electrodes 220 can be placed. In some embodiments, the first electrode 210 and the second electrode 220 may not necessarily extend in one direction but may be disposed in various structures. For example, the first electrode 210 and the second electrode 220 may be partially curved or bent, or any one of the first electrode 210 and the second electrode 220 may surround the other electrode. The structure or shape in which the first electrode 210 and the second electrode 220 are disposed is not particularly limited as long as the first electrode 210 and the second electrode 220 are at least partially spaced to face each other so that an area where the light emitting elements 300 are to be disposed can be formed between the first electrode 210 and the second electrode 220.

As described above, according to some embodiments, the first inner bank 410 may be disposed between the first electrode base layer 230 and the first electrode 210, and the second inner bank 420 may be disposed between the second electrode base layer 240 and the second electrode 220. The electrode base layers 230 and 240 and the electrodes 210 and 220 may be patterned in the same process during the manufacturing process, and the inner banks 410 and 420 may be disposed between them.

Figure 7:
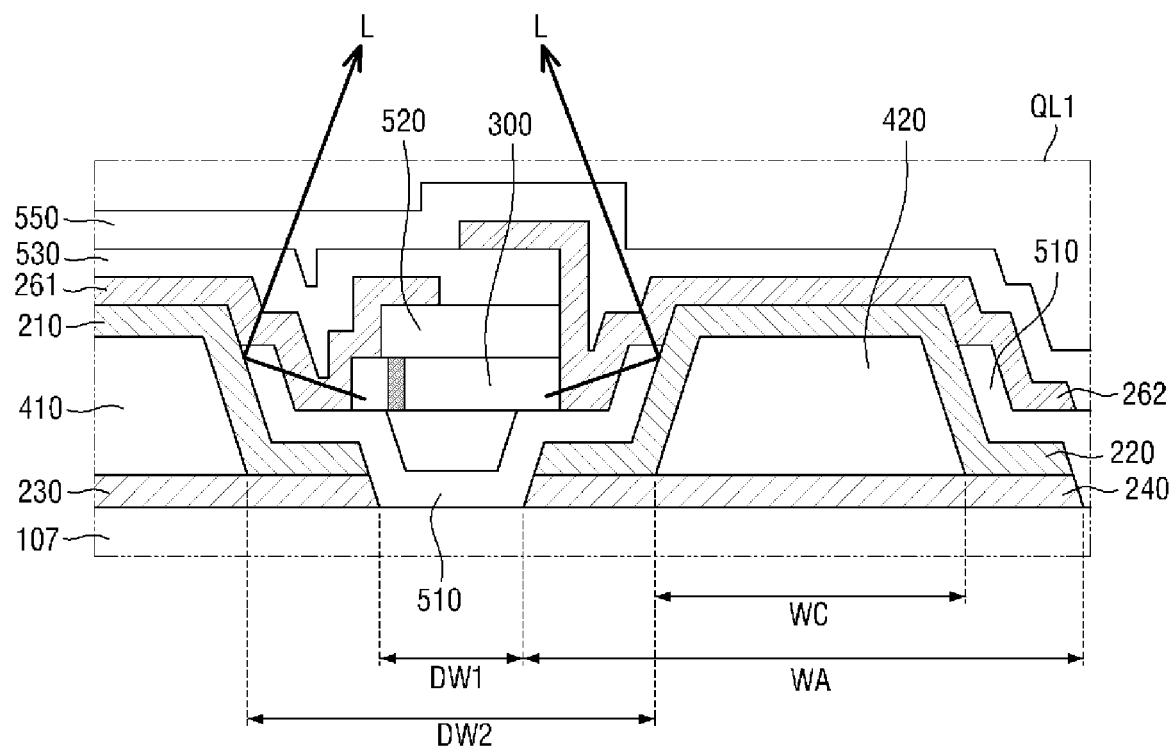
FIG. 7 is a schematic enlarged view of a part QL1 of FIG. 6, according to some embodiments of the present disclosure.

FIG. 7 is a schematic enlarged view of a part QL1 of FIG. 6, according to some embodiments of the present disclosure.

FIG. 7 illustrates the arrangement of the electrode base layers 230 and 240, the inner banks 410 and 420, and the electrodes 210 and 220 in more detail. Referring to FIG. 7, the first electrode base layer 230 and the second electrode base layer 240 may be disposed on the first interlayer insulating layer 107 to be spaced from each other, the first electrode 210 may be disposed on the first electrode base layer 230, and the second electrode 220 may be disposed on the second electrode base layer 240. The first electrode 210 and the second electrode 220 may be spaced from each other, and the light emitting elements 300 may be disposed between the first electrode 210 and the second electrode 220.

The inner banks 410 and 420 may be disposed between the electrode base layers 230 and 240 and the electrodes 210 and 220. For example, the first inner bank 410 may be disposed between the first electrode base layer 230 and the first electrode 210, and the second inner bank 420 may be disposed between the second electrode base layer 240 and the second electrode 220. According to some embodiments, the first inner bank 410 and the second inner bank 420 may be directly disposed on the first electrode base layer 230 and the second electrode base layer 240, respectively, and lower surfaces of the inner banks 410 and 420 may contact the upper surfaces of the electrode base layers 230 and 240. During the manufacturing process of the display device 10, layers constituting the via layer are disposed on the first data conductive layer and may be directly disposed on the first data conductive layer.

In the display device 10 according to the example embodiments, a width WC of each of the inner banks 410 and 420 measured in a direction may be smaller than a width WA of each of the electrode base layers 230 and 240 measured in the direction. During the manufacturing process of the display device 10, the first inner bank 410 and the second inner bank 420 may be patterned in different processes from the electrode base layers 230 and 240, respectively. The inner banks 410 and 420 may be directly disposed on the electrode base layers 230 and 240 and may be formed to have smaller widths than the electrode base layers 230 and 240. Accordingly, the lower surfaces of the inner banks 410 and 420 may directly contact the upper surfaces of the electrode base layers 230 and 240 but may not contact the first interlayer insulating layer 107 disposed under the electrode base layers 230 and 240.

Because the inner banks 410 and 420 are formed to have smaller widths than the electrode base layers 230 and 240, the electrodes 210 and 220 disposed on the inner banks 410 and 420 may be formed to cover the inner banks 410 and 420. In some embodiments, because the electrodes 210 and 220 are patterned and formed in the same process as the electrode base layers 230 and 240, they may have substantially the same width as the electrode base layers 230 and 240. According to some embodiments, the first electrode 210 may cover an outer surface of the first inner bank 410, and the second electrode 220 may cover an outer surface of the second inner bank 420. The widths of the first electrode 210 and the second electrode 220 may be greater than the widths WC of the inner banks 410 and 420. Accordingly, a portion of a lower surface of the first electrode 210 may directly contact a portion of the upper surface of the first electrode base layer 230, and a portion of a lower surface of the second electrode 220 may directly contact a portion of the upper surface of the second electrode base layer 240.

The width WA of each of the electrode base layers 230 and 240 may be greater than the width WC of each of the inner banks 410 and 420, and a portion of the upper surface of each of the electrode base layers 230 and 240 may be exposed. The electrodes 210 and 220 disposed on the electrode base layers 230 and 240 may have greater widths than the inner banks 410 and 420 to cover the outer surfaces of the inner banks 410 and 420. According to some embodiments, a portion of the lower surface of each of the electrodes 210 and 220 of the display device 10 may directly contact a portion of the upper surface of a corresponding one of the electrode base layers 230 and 240.

In some embodiments, as illustrated in the drawing, according to some embodiments, a first distance DW1 between the electrode base layers 230 and 240 may be smaller than a second distance DW2 between the inner banks 410 and 420. Portions where the electrodes 210 and 220 directly contact the electrode base layers 230 and 240 may protrude further than the side surfaces of the inner banks 410 and 420, and at least one end portion of each of the light emitting elements 300 disposed between the inner banks 410 and 420 may be on the first electrode 210 or the second electrode 220. As will be described later, the light emitting elements 300 may be disposed on the first insulating layer 510, and the first insulating layer 510 may cover at least one end portion of each of the electrodes 210 and 220. A length of each of the light emitting elements 300 may be greater than the first distance DW1 between the electrode base layers 230 and 240, and at least one end of each of the light emitting elements 300 disposed between the electrodes 210 and 220 may be on the electrodes 210 and 220. However, embodiments are not limited to this example.

The electrodes 210 and 220 and the electrode base layers 230 and 240 may be concurrently (e.g., simultaneously) patterned and formed in the same process during the manufacturing process of the display device 10. Conductive layers for forming the electrode base layers 230 and 240 and the electrodes 210 and 220 on the first interlayer insulating layer 107 may be patterned together, and the electrode base layers 230 and 240 and the electrodes 210 and 220 may be formed to have substantially the same width. According to some embodiments, a side surface of at least one end portion of each of the first electrode base layer 230 and the second electrode base layer 240 may be at the same line as a side surface of an end portion of a corresponding one of the first electrode 210 and the second electrode 220.

In the drawings, side surfaces of the electrodes 210 and 220 and the side surfaces of the electrode base layers 230 and 240 are inclined, and the electrode base layers 230 and 240 have greater widths than the electrodes 210 and 220. However, this is merely a structural feature that may appear in a patterning process, and the electrodes 210 and 220 and the electrode base layers 230 and 240 may also have substantially the same width.

During the manufacturing process of the display device 10, a conductive layer for forming the electrodes 210 and 220 is disposed on a conductive layer for forming the electrode base layers 230 and 240. Therefore, according to some embodiments, the first electrode 210 and the second electrode 220 may not directly contact the first interlayer insulating layer 107. In some embodiments, at least one side surface of each of the electrode base layers 230 and 240 may not contact the electrode 210 or 220, and the respective side surfaces of the electrode base layers 230 and 240 and the electrodes 210 and 220 may be at the same plane.

The first electrode 210 and the second electrode 220 may cover the inner banks 410 and 420, and at least a portion of each of the first electrode 210 and the second electrode 220 may be disposed on the inclined side surfaces of the inner bank 410 or 420. Light generated by each of the light emitting elements 300 may be emitted through both ends of the light emitting element 300 and may travel toward the first electrode 210 and the second electrode 220 disposed on the inclined side surfaces of the inner banks 410 and 420. As described above, the first electrode 210 and the second electrode 220 may include a material having high reflectivity to reflect incident light ('L' in FIG. 7) toward above the first substrate 101 (e.g., reflect incident light ('L' in FIG. 7) toward an upward direction from the first substrate 101).

Referring again to FIGS. 5 and 6, the first insulating layer 510 may be disposed in the entire emission area EMA but may expose a portion of each of the electrodes 210 and 220. For example, the first insulating layer 510 may be disposed in the entire emission area EMA including the electrodes 210 and 220 but may expose a portion of each of the electrodes 210 and 220 located on the inner banks 410 and 420. Openings may be formed in the first insulating layer 510 to partially expose upper surfaces of the first electrode 210 and the second electrode 220. The openings of the first insulating layer 510 may be formed in portions where the first electrode 210 and the second electrode 220 overlap the inner banks 410 and 420 in the thickness direction. For example, the first insulating layer 510 may be disposed not only in an area between the electrodes 210 and 220 but also on an opposite side of each of the inner banks 410 and 420 from the area. The first insulating layer 510 may be disposed between the first electrode 210 and the second electrode 220 to cover at least a portion of each of the first electrode 210 and the second electrode 220.

As described above, a side surface of an end portion of each of the first electrode 210 and the second electrode 220 may be at the same line as a side surface of an end portion of a corresponding one of the first electrode base layer 230 and the second electrode base layer 240. According to some embodiments, both side surfaces of each of the first electrode base layer 230 and the second electrode base layer 240 may directly contact the first insulating layer 510. During the manufacturing process of the display device 10, the electrodes 210 and 220 and the electrode base layers 230 and 240 may be patterned and formed in the same process, and both side surfaces of the electrodes 210 and 220 and the electrode base layers 230 and 240 may be aligned with each other. For example, as illustrated in FIG. 7, a side surface of an end portion of the first electrode 210 and a side surface of an end portion of the first electrode base layer 230 may be at the same plane (e.g., an inclined side plane), and the side surface of the end portion of the first electrode base layer 230 may contact the first insulating layer 510.

The first insulating layer 510 may protect the first electrode 210 and the second electrode 220 while insulating them from each other. In some embodiments, the first insulating layer 510 may reduce the chance of the light emitting elements 300 disposed on the first insulating layer 510 from directly contacting other members and thus being damaged. However, the shape and structure of the first insulating layer 510 are not limited to the above example.

In some embodiments, the first insulating layer 510 may extend beyond the emission area EMA to be disposed on the first planarization layer 480 of the non-emission area NEA and a portion of the pad electrode 720 of the pad area PDA. The first insulating layer 510 disposed in the pad area PDA may expose a portion of an upper surface of the pad electrode 720, and the exposed upper surface of the pad electrode 720 may contact a pad capping layer 760 (see FIG. 6) to be described later. However, embodiments are not limited to this example, and the first insulating layer 510 may also be disposed only in the emission area EMA.

The light emitting elements 300 may be disposed between the first electrode 210 and the second electrode 220. An end portion of each of the light emitting elements 300 may be electrically connected to the first electrode 210, and the other end portion of each of the light emitting elements 300 may be electrically connected to the second electrode 220. Both ends of each of the light emitting elements 300 may contact the contact electrodes 261 and 262 to be described later and thus may be electrically connected to the first electrode 210 and the second electrode 220 through the contact electrodes 261 and 262, respectively.

The light emitting elements 300 may be spaced from each other and aligned substantially parallel to each other. A distance between the light emitting elements 300 is not particularly limited. In some cases, a plurality of light emitting elements 300 may be disposed adjacent to each other to form a cluster, and a plurality of other light emitting elements 300 may be disposed at regular intervals to form a cluster. In some embodiments, the light emitting elements 300 may have a non-uniform density but may be oriented and aligned in one direction. In some embodiments, the light emitting elements 300 may extend in one direction, and the direction in which each electrode, for example, the first electrode 210 and the second electrode 220 extend may be substantially perpendicular to the direction in which the light emitting elements 300 extend. In some embodiments, the light emitting elements 300 may not be perpendicular but may be oblique to the direction in which each electrode extends.

The light emitting elements 300 according to some embodiments may include active layers 330 (e.g., see FIG. 9) including different materials to emit light of different wavelength bands. The display device 10 according to the example embodiment may include the light emitting elements 300 which emit light of different wavelength bands. Each light emitting element 300 of the first subpixel PX1 may include an active layer 330 that emits light of the first color whose central wavelength band is a first wavelength, each light emitting element 300 of the second subpixel PX2 may include an active layer 330 that emits light of the second color whose central wavelength band is a second wavelength, and each light emitting element 300 of the third subpixel PX3 may include an active layer 330 that emits light of the third color whose central wavelength band is a third wavelength.

Accordingly, the light of the first color may be output from the first subpixel PX1, the light of the second color may be output from the second subpixel PX2, and the light of the third color may be output from the third subpixel PX3. However, embodiments are not limited to this case. In some cases, the first subpixel PX1, the second subpixel PX2, and the third subpixel PX3 may include the light emitting elements 300 of the same type to emit light of substantially the same color.

The light emitting elements 300 may be disposed on the first insulating layer 510 between the electrodes 210 and 220. However, embodiments of the present disclosure are not limited to this example. In some embodiments, at least some of the light emitting elements 300 disposed in each subpixel PXn may be disposed in an area other than the area between the first electrode 210 and the second electrode 220, for example, may be disposed between each of the electrodes 210 and 220 and the outer bank 450. In some embodiments, a portion of each of the light emitting elements 300 may overlap each electrode 210 or 220 in the thickness direction. For example, an end portion of each of the light emitting elements 300 may be disposed on the first electrode 210, and the other end portion of each of the light emitting elements 300 may be disposed on the second electrode 220.

In some embodiments, each of the light emitting elements 300 may include a plurality of layers disposed in a direction parallel to an upper surface of the first substrate 101 or the first insulating layer 510. Each of the light emitting elements 300 of the display device 10 according to some embodiments may extend in a direction and have a structure in which a plurality of semiconductor layers are sequentially disposed along the direction. The direction in which the light emitting elements 300 extend may be parallel to the first insulating layer 510, and the semiconductor layers included in each of the light emitting elements 300 may be sequentially disposed along the direction parallel to the upper surface of the first insulating layer 510. However, embodiments are not limited to this case. In some cases, when each of the light emitting elements 300 has a different structure, the layers may be disposed in a direction perpendicular to the first insulating layer 510. The structure of each of the light emitting elements 300 will be described in more detail later with reference to other drawings.

The second insulating layer 520 may be disposed on the light emitting elements 300. The second insulating layer 520 may expose both ends of each light emitting element 300 and a portion of the upper surface of each of the first electrode 210 and the second electrode 220. For example, a portion of the second insulating layer 520 which is disposed on each of the light emitting elements 300 may extend in the second direction DR2 between the first electrode 210 and the second electrode 220 of the emission area EMA. A portion of the second insulating layer 520 may form a stripe or island pattern in the emission area EMA of each subpixel PXn. The second insulating layer 520 may also partially cover an outer surface of each of the light emitting elements 300 to protect the light emitting element 300 while fixing the light emitting element 300 during the manufacturing process of the display device 10. Here, the second insulating layer 520 may expose both end portions of each of the light emitting elements 300, and the exposed ends of each of the light emitting elements 300 may contact the contact electrodes 261 and 262 which will be described later.

A width of the second insulating layer 520 may be smaller than the length of each of the light emitting elements 300. Therefore, an end portion of each of the light emitting elements 300 may have an end surface and a portion of each side surface exposed, and the other end portion of each of the light emitting elements 300 may have an end surface exposed and side surfaces covered. For example, a side surface of the second insulating layer 520 may be spaced from an end surface of an end portion of each of the light emitting elements 300, and the other side surface may be at the same plane (e.g., same plane along the side surface) as an end surface of the other end portion of each of the light emitting elements 300. However, embodiments are not limited to this example, and both side surfaces of the second insulating layer 520 may also be recessed from both ends of each of the light emitting elements 300.

The contact electrodes 261 and 262 and the third insulating layer 530 may be disposed on the second insulating layer 520 of the emission area EMA.

As illustrated in FIG. 5, the contact electrodes 261 and 262 may extend in a direction. The contact electrodes 261 and 262 may contact the light emitting elements 300 and the electrodes 210 and 220, and the light emitting elements 300 may receive electrical signals from the first electrode 210 and the second electrode 220 through the contact electrodes 261 and 262.

The contact electrodes 261 and 262 may include a first contact electrode 261 and a second contact electrode 262. The first contact electrode 261 and the second contact electrode 262 may be disposed on the first electrode 210 and the second electrode 220, respectively. The first contact electrode 261 may be disposed on the first electrode 210 to extend in the second direction DR2, and the second contact electrode 262 may be disposed on the second electrode 220 to extend in the second direction DR2. The first contact electrode 261 and the second contact electrode 262 may be spaced to face each other in the first direction DR1 and may form stripe patterns in the emission area EMA of each subpixel PXn.

In some embodiments, a width of each of the first contact electrode 261 and the second contact electrode 262 measured in a direction may be equal to or greater than a width of each of the first electrode 210 and the second electrode 220 measured in the direction. The first contact electrode 261 and the second contact electrode 262 may respectively contact both ends of each light emitting element 300 and cover the upper surfaces of the first electrode 210 and the second electrode 220. However, embodiments are not limited to this example. In some cases, the first contact electrode 261 and the second contact electrode 262 may only partially cover the first electrode 210 and the second electrode 220.

According to some embodiments, a semiconductor layer may be exposed at end surfaces of each light emitting element 300 in the direction in which each light emitting element 300 extends, and the first contact electrode 261 and the second contact electrode 262 may contact each light emitting element 300 at the end surfaces where the semiconductor layer is exposed. In some embodiments, the side surfaces of both ends of each light emitting element 300 may be partially exposed. During the manufacturing process of the display device 10, an insulating film 380 (see FIG. 9) surrounding an outer surface of the semiconductor layer of each light emitting element 300 may be partially removed in a process of forming the second insulating layer 520 that covers the outer surface of each light emitting element 300, and the exposed side surfaces of each light emitting element 300 may contact the first contact electrode 261 and the second contact electrode 262.

Although one first contact electrode 261 and one second contact electrode 262 are disposed in one subpixel PXn in the drawings, embodiments are not limited to this example. The number of the first contact electrodes 261 and the second contact electrodes 262 may vary according to the number of the first electrodes 210 and the second electrodes 220 disposed in each subpixel PXn.

In some embodiments, as illustrated in FIG. 6, the first contact electrode 261 is disposed on the first electrode 210 and the second insulating layer 520. The first contact electrode 261 may contact an end portion of each light emitting element 300 and the exposed upper surface of the first electrode 210. The end portion of each light emitting element 300 may be electrically connected to the first electrode 210 through the first contact electrode 261.

The third insulating layer 530 is disposed on the first contact electrode 261. The third insulating layer 530 may electrically insulate the first contact electrode 261 and the second contact electrode 262 from each other. The third insulating layer 530 may be disposed to cover the first contact electrode 261 but may not be disposed on the other end portion of each light emitting element 300 so that the light emitting element 300 can contact the second contact electrode 262. The third insulating layer 530 may partially contact the first contact electrode 261 and the second insulating layer 520 on an upper surface of the second insulating layer 520. A side surface of the third insulating layer 530 in a direction in which the second electrode 220 is disposed may be aligned with a side surface of the second insulating layer 520. In some embodiments, the third insulating layer 530 may be disposed in the non-emission area NEA, for example, on the first insulating layer 510 disposed on the first planarization layer 480. However, embodiments are not limited to this example.

The second contact electrode 262 is disposed on the second electrode 220, the second insulating layer 520, and the third insulating layer 530. The second contact electrode 262 may contact the other end portion of each light emitting element 300 and the exposed upper surface of the second electrode 220. The other end portion of each light emitting element 300 may be electrically connected to the second electrode 220 through the second contact electrode 262.

For example, the first contact electrode 261 may be disposed between the first electrode 210 and the third insulating layer 530, and the second contact electrode 262 may be disposed on the third insulating layer 530. The second contact electrode 262 may partially contact the second insulating layer 520, the third insulating layer 530, the second electrode 220, and the light emitting elements 300. An end portion of the second contact electrode 262 in a direction in which the first electrode 210 is disposed may be disposed on the third insulating layer 530. The first contact electrode 261 and the second contact electrode 262 may not contact each other due to the second insulating layer 520 and the third insulating layer 530. However, embodiments are not limited to this example. In some cases, the third insulating layer 530 may be omitted.

The contact electrodes 261 and 262 may include a conductive material such as ITO, IZO, ITZO, or aluminum (Al). For example, the contact electrodes 261 and 262 may include a transparent conductive material, and light emitted from each light emitting element 300 may pass through the contact electrodes 261 and 262 and travel toward the electrodes 210 and 220. As illustrated in FIG. 7, each electrode 210 or 220 may include a material having high reflectivity, and the electrodes 210 and 220 disposed on the inclined side surfaces of the inner banks 410 and 420 may reflect incident light L toward above the first substrate 101 (e.g., reflect incident light toward an upward direction from the first substrate 101).

However, embodiments of the present disclosure are not limited to this example. In some embodiments, the contact electrodes 261 and 262 may include a material having high reflectivity to reflect light emitted from the light emitting elements 300. In the display device 10, the emission area EMA in which the light emitting elements 300 are disposed and the non-emission area NEA in which circuit elements and wirings are disposed may be separated, and the light emitting elements 300 may not overlap the circuit elements or wirings in the thickness direction. When the contact electrodes 261 and 262 include a material having high reflectivity, light emitted from the light emitting elements 300 may be reflected by the contact electrodes 261 and 262 toward under the first substrate 101. For example, the display device 10 may have a bottom emission structure. This will be described with reference to some embodiments.

The pad capping layer 760 disposed at the same layer as the contact electrodes 261 and 262 may be disposed on the pad electrode 720 of the non-display area NDA. The pad capping layer 760 may contact an exposed portion of the upper surface of the pad electrode 720 on which the first insulating layer 510 is not disposed. The pad capping layer 760 may include the same material as the contact electrodes 261 and 262 and may be electrically connected to the pad electrode 720 while covering the pad electrode 720 to protect the pad electrode 720. Although the first insulating layer 510 is disposed on the pad electrode 720 and the pad capping layer 760 covers only a portion of the pad electrode 720 in the drawings, embodiments are not limited to this example. In some embodiments, the first insulating layer 510 may not be disposed in the non-display area NDA, and the pad capping layer 760 may be disposed to cover outer surfaces of the pad electrode 720 and the pad base layer 710.

The fourth insulating layer 550 may be disposed on the entire surface of the first substrate 101 over the emission area EMA, the non-emission area NEA and the non-display area NDA. The fourth insulating layer 550 may function to protect members disposed on the first substrate 101 from the external environment.

Each of the first insulating layer 510, the second insulating layer 520, the third insulating layer 530, and the fourth insulating layer 550 described above may include an inorganic insulating material or an organic insulating material. In some example embodiments, each of the first insulating layer 510, the second insulating layer 520, the third insulating layer 530, and the fourth insulating layer 550 may include an inorganic insulating material such as silicon oxide (SiOx), silicon nitride (SiNx), silicon oxynitride (SiOxNy), aluminum oxide ($Al_2O_3$), or aluminum nitride (AlN). In some embodiments, each of the first insulating layer 510, the second insulating layer 520, the third insulating layer 530, and the fourth insulating layer 550 may include an organic insulating material such as acrylic resin, epoxy resin, phenolic resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, or polymethyl methacrylate-polycarbonate synthetic resin.

Figure 8:
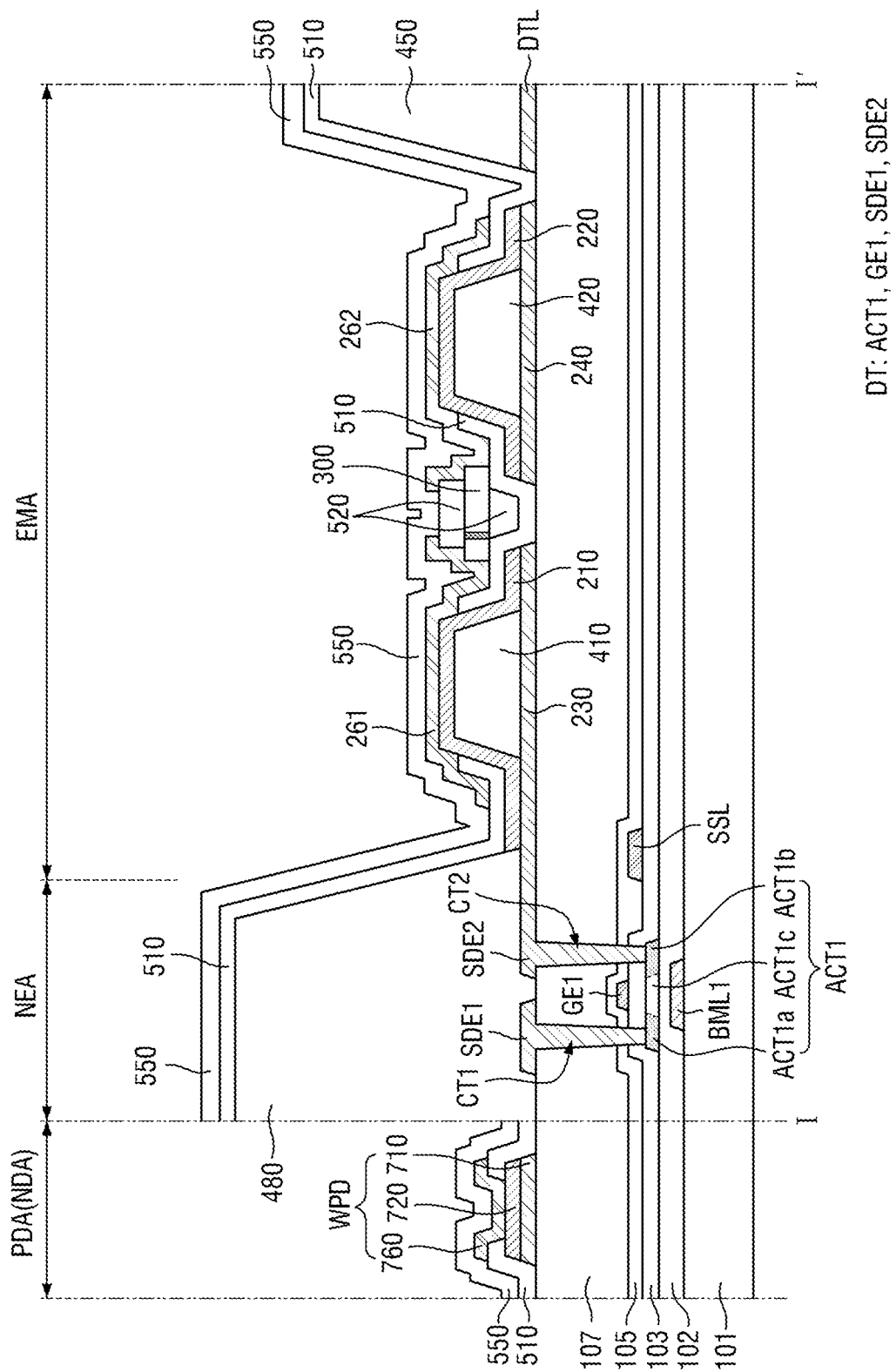
FIG. 8 is a partial cross-sectional view of a display device, according to some embodiments of the present disclosure.

FIG. 8 is a partial cross-sectional view of a display device 10, according to some embodiments of the present disclosure.

Referring to FIG. 8, in the display device 10 according to the example embodiment, a third insulating layer 530 may be omitted, and a portion of a second contact electrode 262 may be directly disposed on a second insulating layer 520. A first contact electrode 261 and the second contact electrode 262 may be spaced from each other on the second insulating layer 520. The second insulating layer 520 may include an organic insulating material, and the first contact electrode 261 and the second contact electrode 262 may be formed together in the same process. Here, a width of the second insulating layer 520 may be smaller than a length of a light emitting element 300, and both side surfaces of the second insulating layer 520 may be spaced from both end surfaces of the light emitting element 300. For example, the second insulating layer 520 may expose the end surfaces and side surfaces of both ends of the light emitting element 300.

Facing side surfaces of the first contact electrode 261 and the second contact electrode 262 may be disposed on the second insulating layer 520 to be spaced from each other.

The first contact electrode 261 may contact an end portion of the light emitting element 300, a first electrode 210 and the second insulating layer 520, and the second contact electrode 262 may contact the other end portion of the light emitting element 300, a second electrode 220 and the second insulating layer 520. Other details are the same as those described above, and thus a detailed description thereof will not be provided in detail, as a person of ordinary skill in the art will be able to describe such elements from the details provided in other parts of this disclosure.

According to some embodiments, the electrode base layers 230 and 240 of the display device 10 located in the emission area EMA to provide an area where the light emitting elements 300 are disposed may be disposed at the same layer as circuit elements located in the non-emission area NEA to drive the light emitting elements 300. In some embodiments, the electrode base layers 230 and 240 may be patterned in the same process as the electrodes 210 and 220 disposed on the electrode base layers 230 and 240. Therefore, the number of manufacturing processes of the display device 10 according to example embodiments can be reduced.

The light emitting elements 300 may be LEDs. In some embodiments, each of the light emitting elements 300 may be an inorganic LED having a size of micrometers or nanometers and made of an inorganic material. When an electric field is formed in a specific direction between two electrodes facing each other, the inorganic LED may be aligned between the two electrodes in which polarity is formed. The light emitting element 300 may be aligned between the two electrodes by the electric field formed on the electrodes.

The light emitting elements 300 according to some embodiments may extend in one direction. Each of the light emitting elements 300 may be shaped like a rod, a wire, a tube, or the like. In some example embodiments, each of the light emitting elements 300 may be shaped like a cylinder or a rod. In some embodiments, each of the light emitting elements 300 may have various shapes including polygonal prisms such as a cube, a rectangular parallelepiped and a hexagonal prism and a shape extending in a direction and having a partially inclined outer surface. A plurality of semiconductors included in each of the light emitting elements 300 which will be described later may be sequentially disposed or stacked along the above direction.

Each of the light emitting elements 300 may include a semiconductor layer doped with impurities of any conductivity type (e.g., a p type or an n type). The semiconductor layer may receive an electrical signal from an external power source and emit the electrical signal as light of a specific wavelength band.

Figure 9:
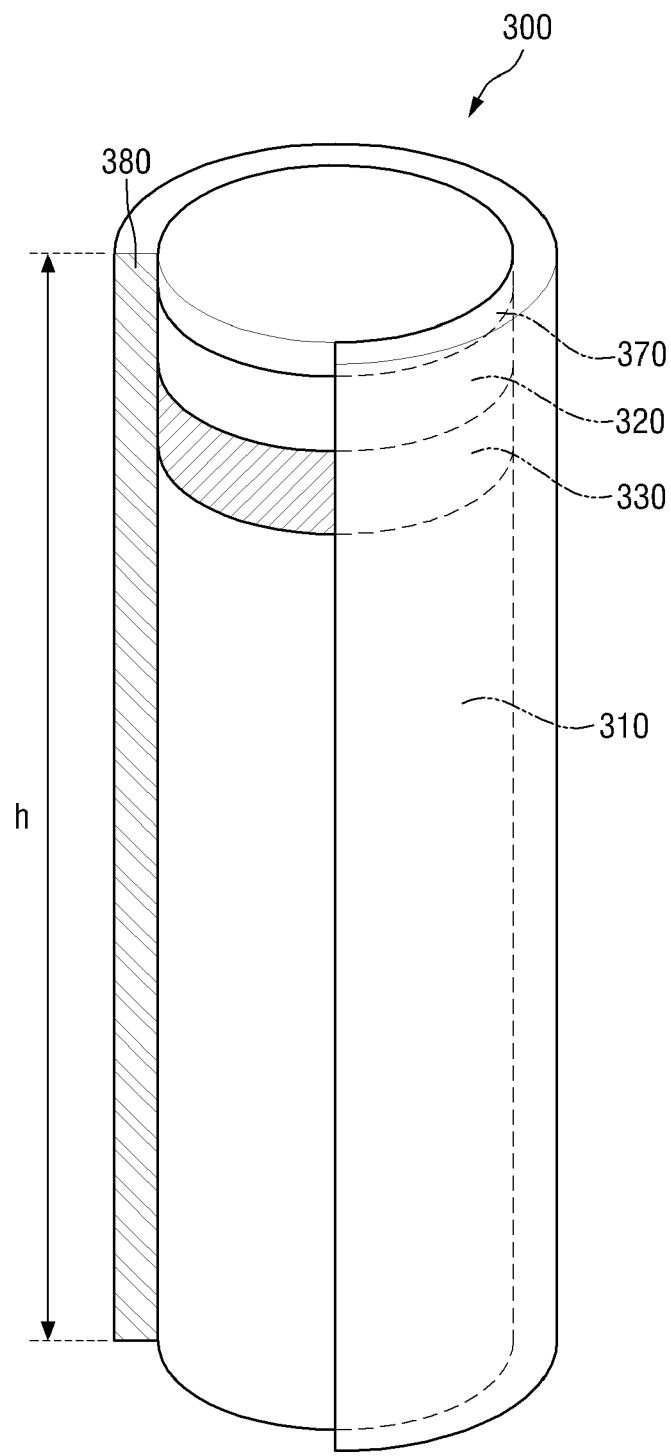
FIG. 9 is a schematic view of a light emitting element, according to some embodiments of the present disclosure.

FIG. 9 is a schematic view of a light emitting element 300 according to some embodiments of the present disclosure.

Referring to FIG. 9, the light emitting element 300 may include a first semiconductor 310, a second semiconductor 320, an active layer 330, an electrode layer 370, and an insulating film 380.

The first semiconductor layer 310 may be an n-type semiconductor. In some example embodiments, if the light emitting element 300 emits light in a blue wavelength band, the first semiconductor layer 310 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 310 may be any one or more of n-type doped AlGaInN, GaN, AlGaN, InGaN, AlN, and InN. The first semiconductor layer 310 may be doped with an n-type dopant, and the n-type dopant may be, for example, Si, Ge, or Sn. In some example embodiments, the first semiconductor layer 310 may be n-GaN doped with n-type Si. A length of the first semiconductor layer 310 may be in the range of, but not limited to, 1.5 µm to 5 µm.

The second semiconductor layer 320 is disposed on the active layer 330 to be described later. The second semiconductor layer 320 may be a p-type semiconductor. In some example embodiments, if the light emitting element 300 emits light in a blue or green wavelength band, the second semiconductor layer 320 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 320 may be any one or more of p-type doped AlGaInN, GaN, AlGaN, InGaN, AlN, and InN. The second semiconductor layer 320 may be doped with a p-type dopant, and the p-type dopant may be, for example, Mg, Zn, Ca, Se, or Ba. In some example embodiments, the second semiconductor layer 320 may be p-GaN doped with p-type Mg. A length of the second semiconductor layer 320 may be in the range of, but not limited to, 0.05 µm to 0.10 µm.

Although each of the first semiconductor layer 310 and the second semiconductor layer 320 is composed of one layer in the drawing, embodiments are not limited to this case. In some embodiments, each of the first semiconductor layer 310 and the second semiconductor layer 320 may include more layers, for example, may further include a clad layer or a tensile strain barrier reducing (TSBR) layer depending on the material of the active layer 330. This will be described later with reference to other drawings.

The active layer 330 is disposed between the first semiconductor layer 310 and the second semiconductor layer 320. The active layer 330 may include a material having a single or multiple quantum well structure. When the active layer 330 includes a material having a multiple quantum well structure, it may have a structure in which a plurality of quantum layers and a plurality of well layers are alternately stacked. The active layer 330 may emit light through combination of electron-hole pairs according to electrical signals received through the first semiconductor layer 310 and the second semiconductor layer 320. For example, when the active layer 330 emits light in the blue wavelength band, it may include a material such as AlGaN or AlGaInN. In particular, when the active layer 330 has a multiple quantum well structure in which a quantum layer and a well layer are alternately stacked, the quantum layer may include a material such as AlGaN or AlGaInN, and the well layer may include a material such as GaN or AlInN. In some example embodiments, the active layer 330 may include AlGaInN as a quantum layer and AlInN as a well layer and may emit blue light whose central wavelength band is in the range of 450 nm to 495 nm.

In some embodiments, the active layer 330 may have a structure in which a semiconductor material having a large band gap energy and a semiconductor material having a small band gap energy are alternately stacked or may include different group 3 to 5 semiconductor materials depending on the wavelength band of emitted light. Light emitted from the active layer 330 is not limited to light in the blue wavelength band. In some cases, the active layer 330 may emit light in a red or green wavelength band. A length of the active layer 330 may be in the range of, but not limited to, 0.05 µm to 0.10 µm.

Light emitted from the active layer 330 may be radiated not only through an outer surface of the light emitting element 300 in a longitudinal direction, but also through both side surfaces. The direction of light emitted from the active layer 330 is not limited to one direction.

The electrode layer 370 may be an ohmic contact electrode. However, the electrode layer 370 is not limited to the ohmic contact electrode and may also be a Schottky contact electrode. The light emitting element 300 may include at least one electrode layer 370. Although the light emitting element 300 includes one electrode layer 370 in FIG. 9, embodiments are not limited to this example. In some cases, the light emitting element 300 may include more electrode layers 370, or the electrode layer 370 may be omitted. The following description of the light emitting element 300 may apply equally even when the light emitting element 300 includes a different number of electrode layers 370 or further includes another structure.

When the light emitting element 300 is electrically connected to the electrodes 210 and 220 or the contact electrodes 261 and 262, the electrode layer 370 may reduce the resistance between the light emitting element 300 and the electrodes 210 and 220 or the contact electrodes 261 and 262. The electrode layer 370 may include a conductive metal. For example, the electrode layer 370 may include at least any one of aluminum (Al), titanium (Ti), indium (In), gold (Au), silver (Ag), indium-tin oxide (ITO), indium-zinc oxide (IZO), and indium-tin-zinc oxide (ITZO). In some embodiments, the electrode layer 370 may include an n-type or p-type doped semiconductor material. The electrode layer 370 may include the same material or different materials, but embodiments are not limited to this case.

The insulating film 380 surrounds outer surfaces of the semiconductor layers and the electrode layers described above. In some example embodiments, the insulating film 380 may surround an outer surface of at least the active layer 330 and extend in the direction in which the light emitting element 300 extends. The insulating film 380 may protect the above members (e.g., 310, 320, 330, 370). For example, the insulating film 380 may surround side surfaces of the above members but may expose both ends of the light emitting element 300 in the longitudinal direction.

In the drawing, the insulating film 380 extends in the longitudinal direction of the light emitting element 300 to cover from side surfaces of the first semiconductor layer 310 to side surfaces of the electrode layer 370. However, embodiments are not limited to this example. The insulating film 380 may also cover outer surfaces of the active layer 330 and only some semiconductor layers or may cover only a portion of an outer surface of the electrode layer 370 to partially expose the outer surface of the electrode layer 370. In some embodiments, an upper surface of the insulating film 380 may be rounded in cross section in an area adjacent to at least one end portion of the light emitting element 300.

A thickness of the insulating film 380 may be in the range of, but not limited to, 10 nm to 1.0 μm. The thickness of the insulating film 380 may be about 40 nm.

The insulating film 380 may include an insulating material such as silicon oxide (SiOx), silicon nitride (SiNx), silicon oxynitride (SiOxNy), aluminum nitride (AlN), or aluminum oxide ($Al_2O_3$). Accordingly, it can prevent (or reduce the chance for) an electrical short circuit that may occur when the active layer 330 directly contacts an electrode that transmits an electrical signal to the light emitting element 300. In some embodiments, because the insulating film 380 protects the outer surface of the light emitting element 300 including the active layer 330, a reduction in luminous efficiency can be prevented or substantially avoided.

In some embodiments, an outer surface of the insulating film 380 may be treated. When the display device 10 is manufactured, the light emitting element 300 dispersed in an ink (e.g., a predetermined or set ink) may be sprayed onto electrodes and then aligned. Here, the surface of the insulating film 380 may be hydrophobic or hydrophilic-treated so that the light emitting element 300 is kept separate in the ink without being agglomerated with other adjacent light emitting elements 300.

A length h of the light emitting element 300 may be in the range of 1 μm to 10 μm or 2 μm to 6 μm and in some embodiments may be in the range of 3 μm to 5 μm. In some embodiments, a diameter of the light emitting element 300 may be in the range of 300 nm to 700 nm, and an aspect ratio of the light emitting element 300 may be 1.2 to 100. However, embodiments are not limited to this example, and a plurality of light emitting elements 300 included in the display device 10 may also have different diameters according to a difference in composition of the active layer 330. The diameter of the light emitting element 300 may be (or may preferably be) about 500 nm.

A process of manufacturing the display device 10 will now be described with reference to other drawings. The sequence of the manufacturing process of the display device 10 will be described in detail below, but a method of forming each member will not be described.

FIGS. 10 through 18 are cross-sectional views illustrating part of a process of manufacturing a display device, according to some embodiments of the present disclosure.

Figure 10:
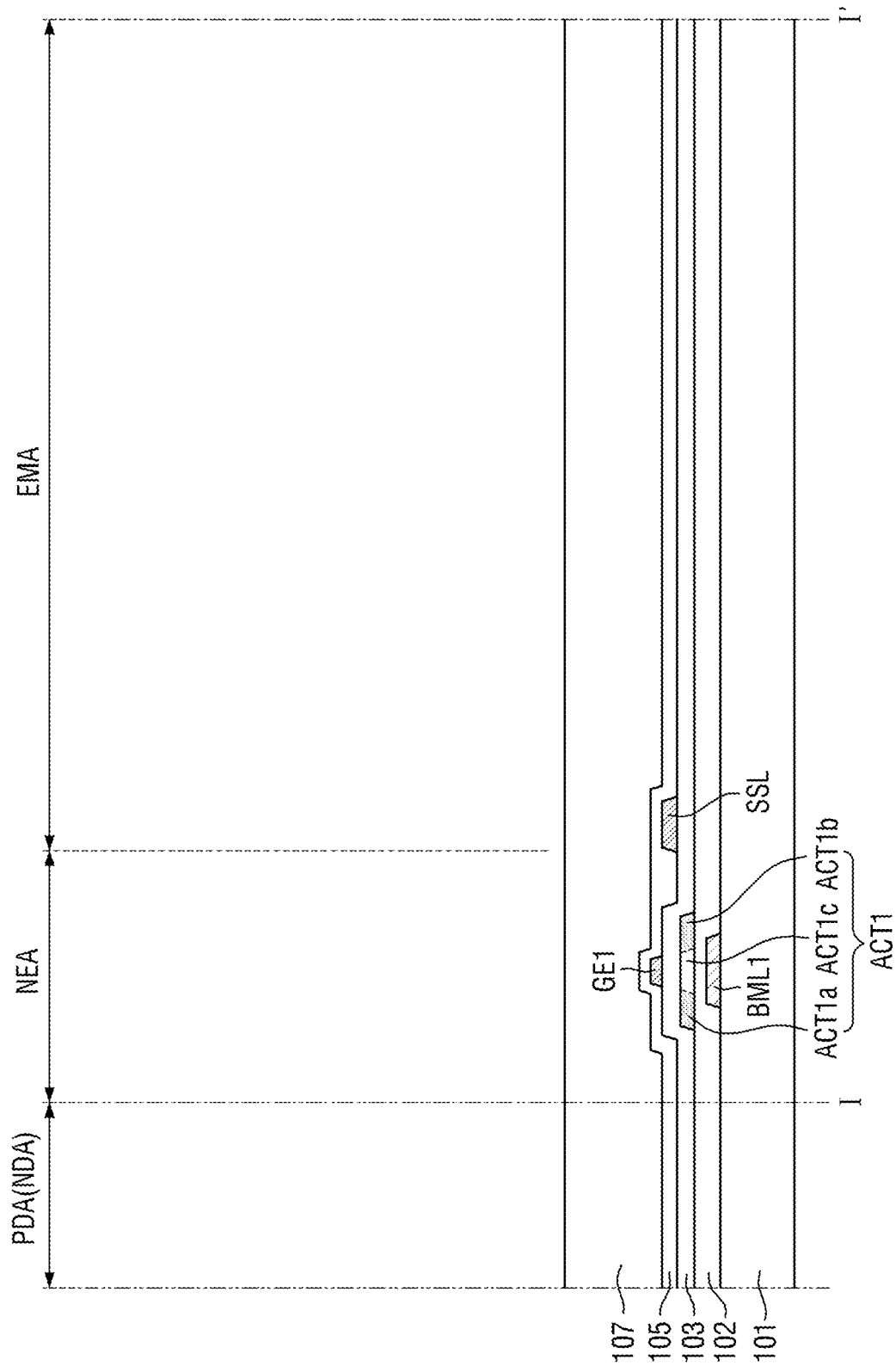
FIGS. 10-18 are cross-sectional views illustrating nine part of a process of manufacturing a display device, according to some embodiments of the present disclosure.

First, referring to FIG. 10, a first substrate 101 is prepared, and a buffer layer 102, a semiconductor layer, a first gate insulating layer 103, a first gate conductive layer, a first protective layer 105, and a first interlayer insulating layer 107 are formed on the first substrate 101. The conductive layers and the insulating layers may be formed by a conventional process, and thus a detailed description thereof will not be provided in detail, as a person of ordinary skill in the art will be able to describe such elements from the details provided in other parts of this disclosure.

Figure 11:
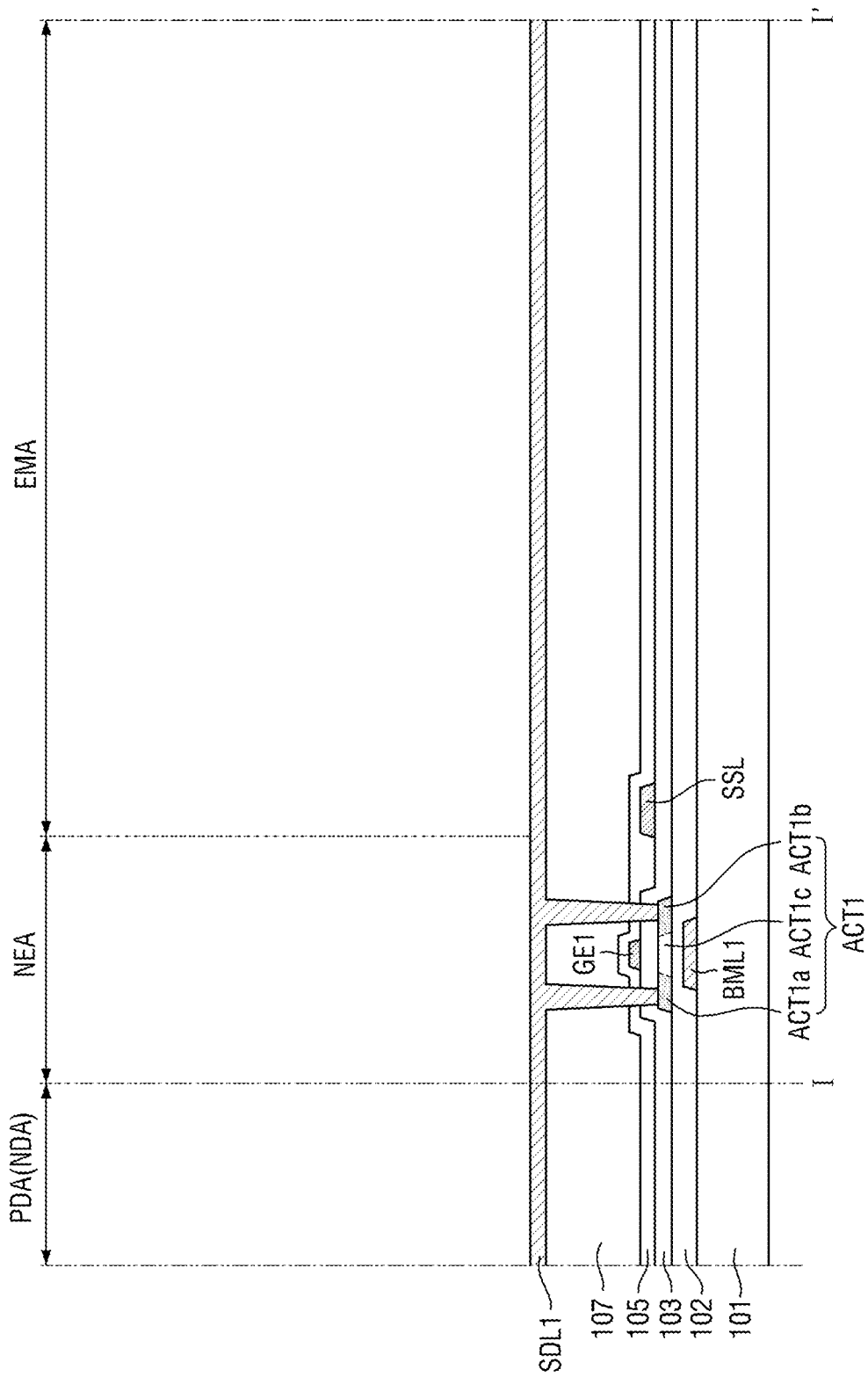

Next, referring to FIG. 11, a first base conductive layer SDL1 is formed on the first interlayer insulating layer 107. The first base conductive layer SDL1 may be placed on the entire surface of the first interlayer insulating layer 107 and patterned in a subsequent process to form a first data conductive layer. For example, a portion of the first base conductive layer SDL1 which is disposed in a non-emission area NEA may form source/drain electrodes SDE1 and SDE2 of a driving transistor DT, a portion of the base conductive layer SDL1 which is disposed in an emission area EMA may form electrode base layers 230 and 240, and a portion of the base conductive layer SDL1 which is disposed in a pad area PDA may form a pad base layer 710.

As described above, in the display device 10 according to example embodiments, the first data conductive layer and electrodes 210 and 220 may be patterned and formed in the same process. The first base conductive layer SDL1 may patterned at the same time as an electrode conductive layer RMTL (see FIG. 16), which is disposed on the first base conductive layer SDL1, in a subsequent process to form the electrode base layers 230 and 240 and the pad base layer 710. However, the first base conductive layer SDL1 disposed in the non-emission area NEA may be patterned along the shape of wirings and conductive patterns disposed in each pixel PX or subpixel PXn.

Figure 12:
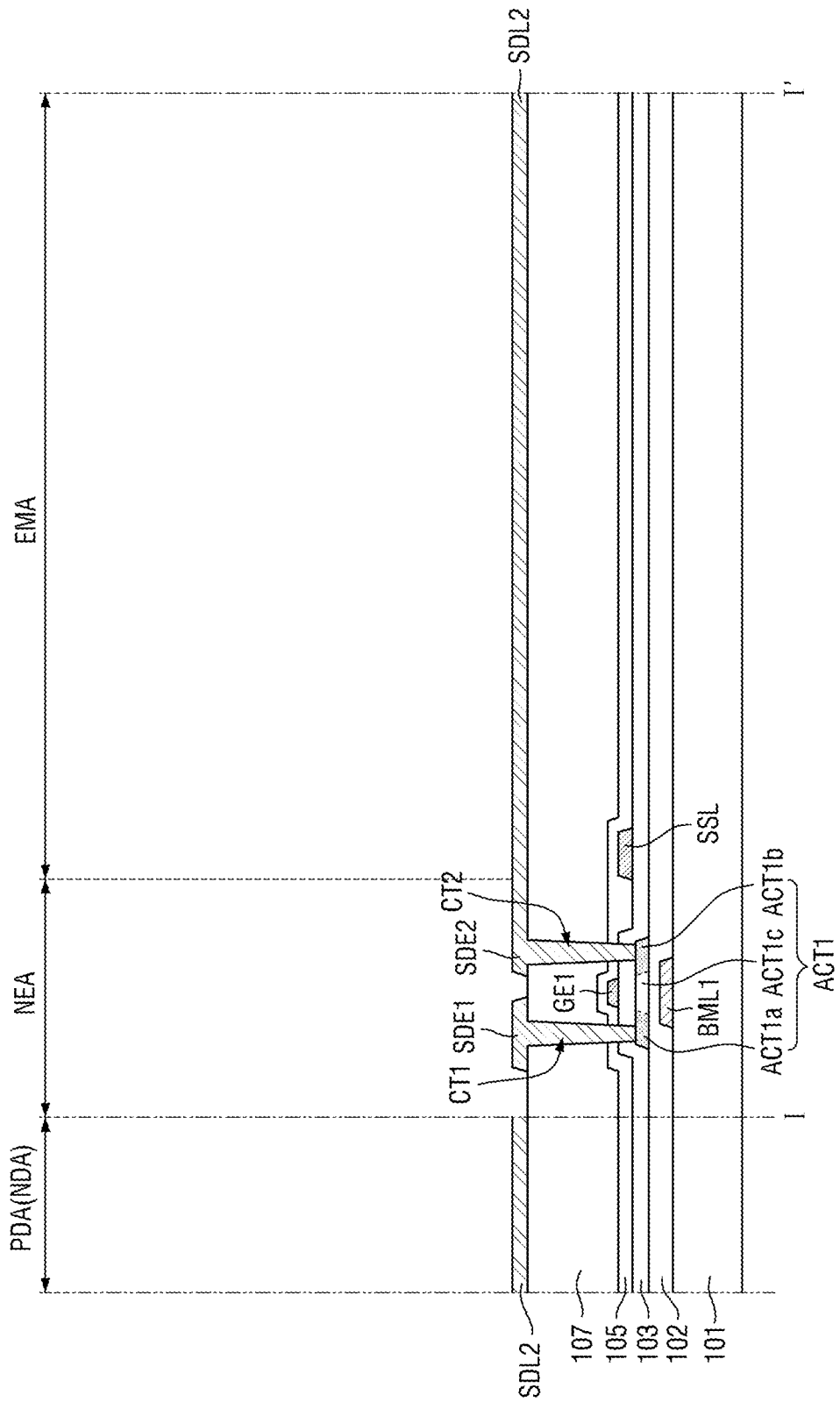

Referring to FIG. 12, the part of the first base conductive layer SDL1 which is disposed in the non-emission area NEA is patterned to form a second base conductive layer SDL2 including a plurality of wirings and conductive patterns. The second base conductive layer SDL2 may be entirely disposed in the emission area EMA and the pad area PDA but may be partially patterned in the non-emission area NEA. Portions of the second base conductive layer SDL2 which are disposed in the non-emission area NEA may form wirings and conductive patterns of each pixel PX or subpixel PXn. In some embodiments, portions of the second base conductive layer SDL2 which are disposed in the emission area EMA and the pad area PDA may be patterned at the same time as the electrode conductive layer RMTL (e.g., see FIG. 16).

Figure 13:
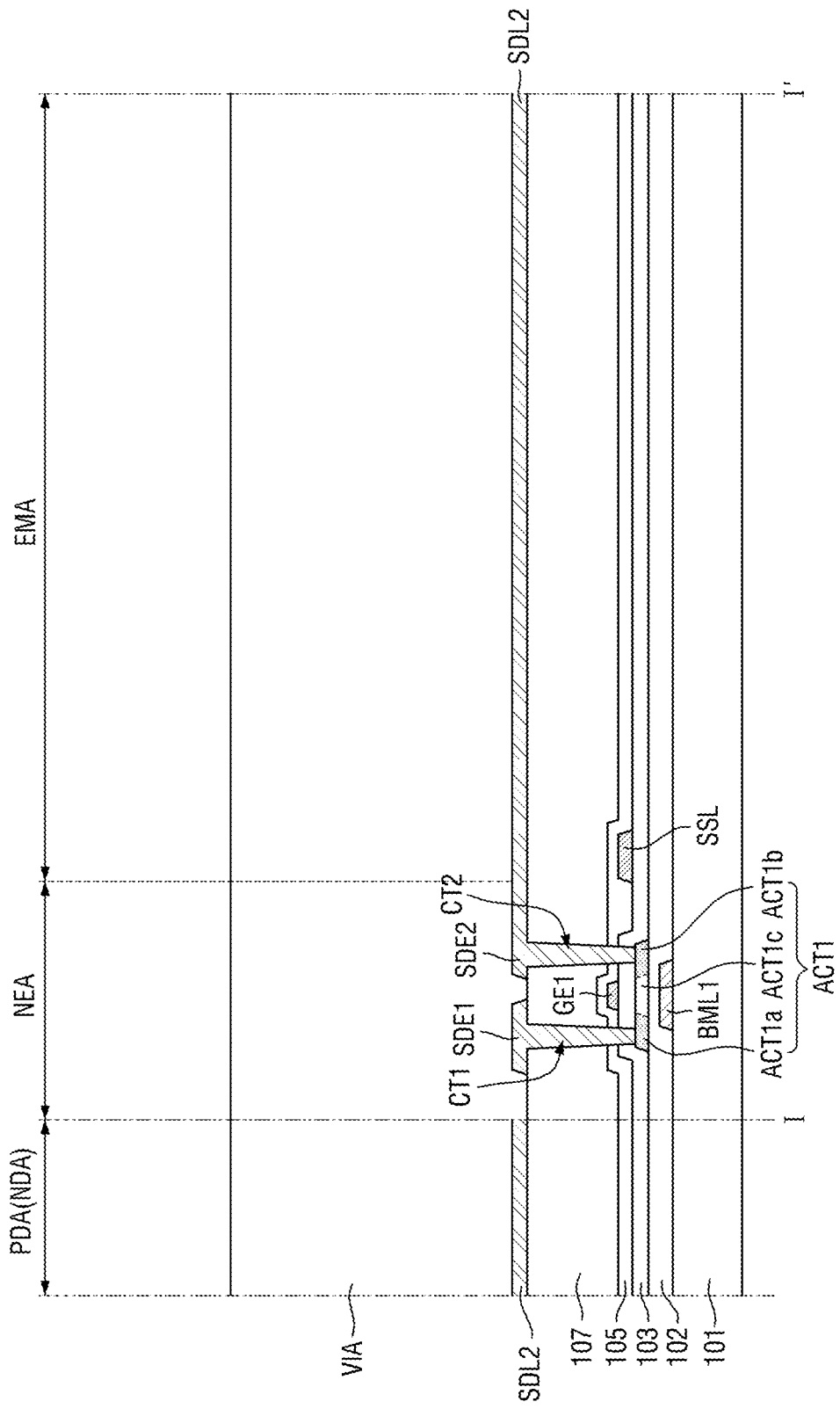
Figure 14:
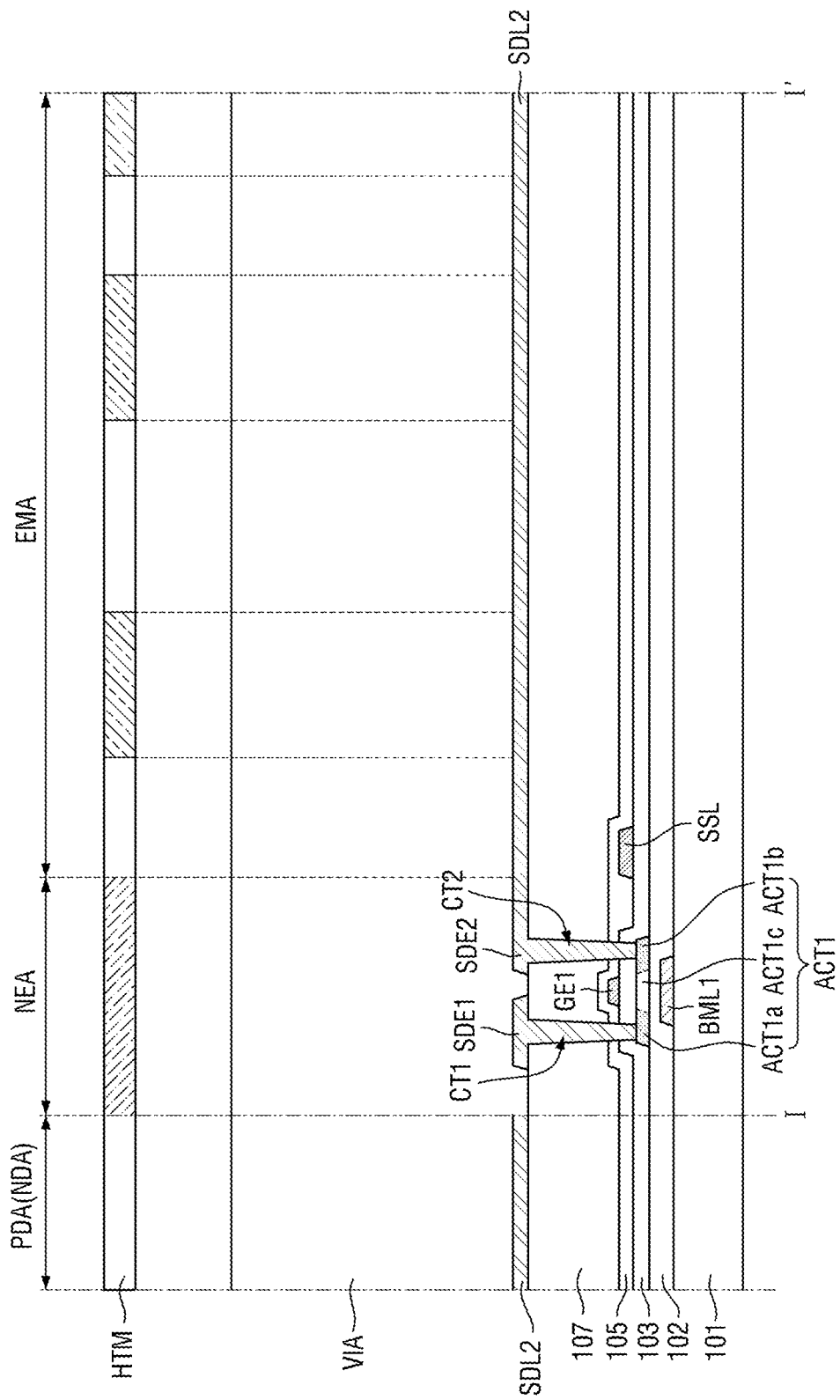
Figure 15:
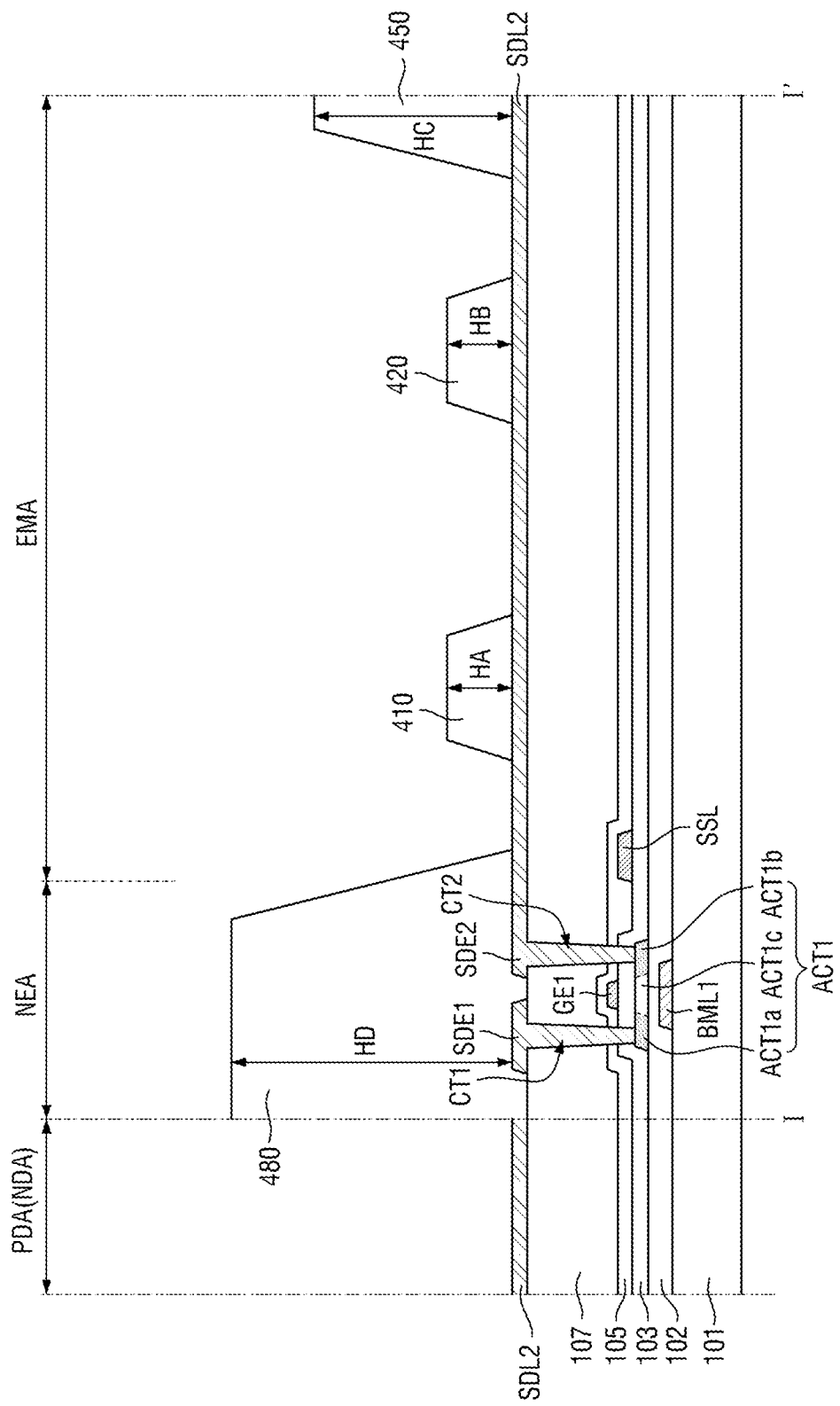

Next, referring to FIGS. 13 through 15, a via layer is formed on the second base conductive layer SDL2. A first planarization layer 480 is formed on the second base conductive layer SDL2 of the non-emission area NEA, and inner banks 410 and 420 and an outer bank 450 are formed on the second base conductive layer SDL2 of the emission area EMA. According to some embodiments, during the manufacturing process of the display device 10, the planarization layer 480, the inner banks 410 and 420, and the outer bank 450 are formed in the same process but may be formed to have different heights. For example, the first planarization layer 480, the inner banks 410 and 420, and the outer bank 450 may be formed to have different heights through a patterning process using a multi-halftone mask.

First, referring to FIG. 13, an insulating material layer VIA is formed to cover the first interlayer insulating layer 107 and the second base conductive layer SDL2. The insulating material layer VIA may include the same material as the via layer and may include, for example, an organic insulating material such as polyimide (PI).

Next, referring to FIGS. 14 and 15, the insulating material layer VIA is patterned using a multi-halftone mask HTM to form the first planarization layer 480, the inner banks 410 and 420, and the outer bank 450. Because slits are formed in some areas of the multi-halftone mask HTM, the amount of light transmitted may vary depending on area. As illustrated in the drawings, different slits may be formed in portions of the multi-halftone mask HTM which correspond to the non-emission area NEA and portions of the emission area EMA, and different amounts of light may be transmitted through the areas where the slits are located. Accordingly, different amounts of light may be irradiated to different areas of the insulating material layer VIA, and the amount of the insulating material layer VIA removed by an exposure and development process may vary depending on position. As a result, the first planarization layer 480, the inner banks 410 and 420, and the outer bank 450 may be formed to have different heights.

According to some embodiments, in the display device 10, heights HA and HB of the inner banks 410 and 420 may be smaller than heights HC and HD of the outer bank 450 and the first planarization layer 480. In some embodiments, the height HD of the first planarization layer 480 may be smaller than the height HC of the outer bank 450.

The inner banks 410 and 420 may be spaced from each other to provide an area where light emitting elements 300 can be disposed and may be reflective barriers that reflect light emitted from the light emitting elements 300. For example, the inner banks 410 and 420 may be high enough to provide an area where the light emitting elements 300 can be disposed and reflect light emitted from the light emitting elements 300. On the other hand, the outer bank 450 may separate each subpixel PXn while preventing or substantially preventing an ink in which the light emitting elements 300 are dispersed from overflowing to other neighboring subpixels PXn during the manufacturing process of the display device 10. Therefore, the outer bank 450 according to some embodiments may be formed to a height greater than the heights HA and HB of the inner banks 410 and 420 so as to prevent or reduce the chance of overflowing of the ink in which the light emitting elements 300 are dispersed.

The first planarization layer 480 may be disposed in the non-emission area NEA to planarize steps formed by circuit elements, e.g., transistors DT, SCT, and SST disposed under the first planarization layer 480 while protecting the circuit elements. Because the first planarization layer 480, unlike the inner banks 410 and 420 and the outer bank 450, may be formed in the entire non-emission area NEA, it may be formed relatively thick. In some embodiments, the height HD of the first planarization layer 480 may be greater than the heights of the inner banks 410 and 420 and the outer bank 450.

Figure 16:
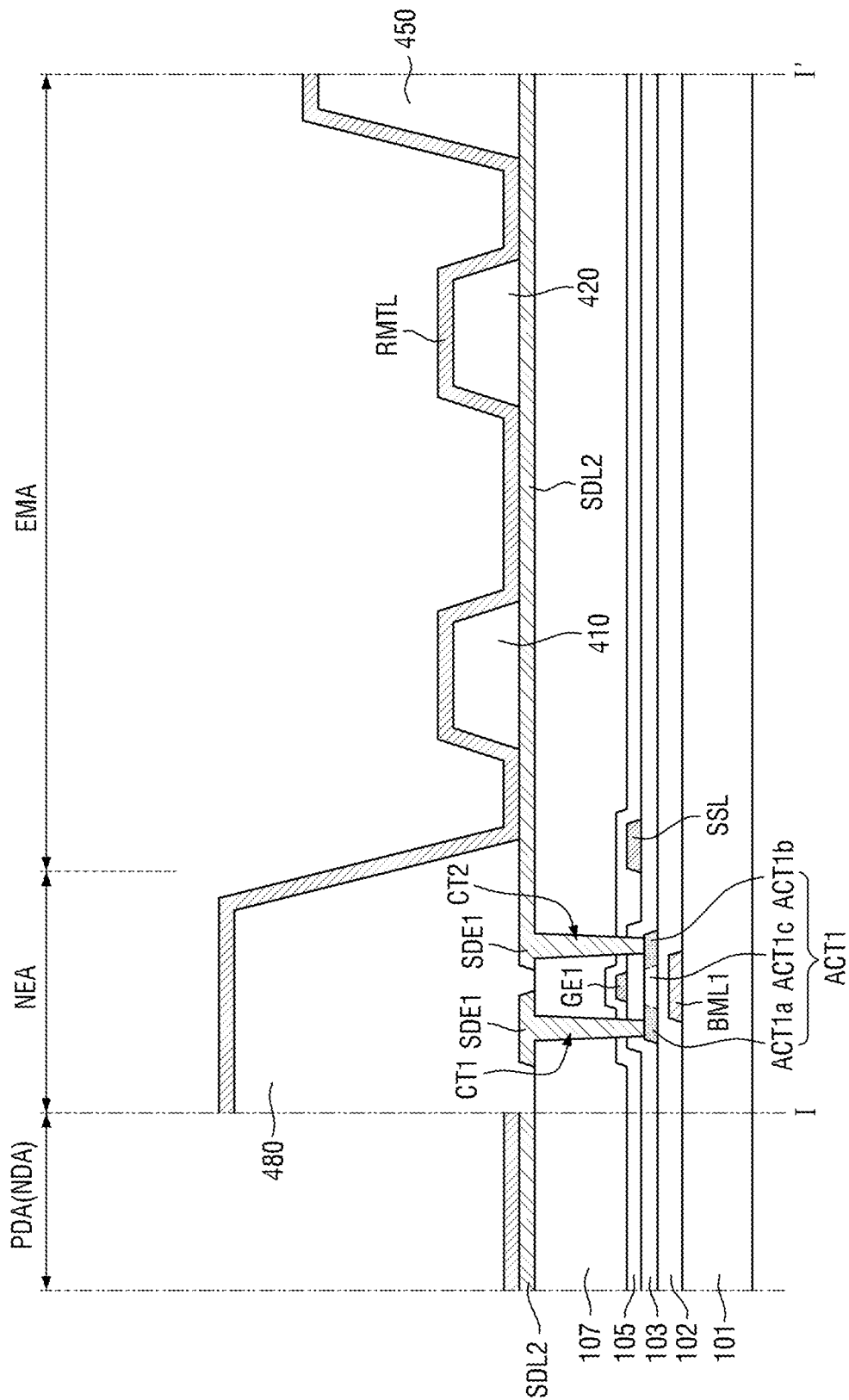
Figure 17:
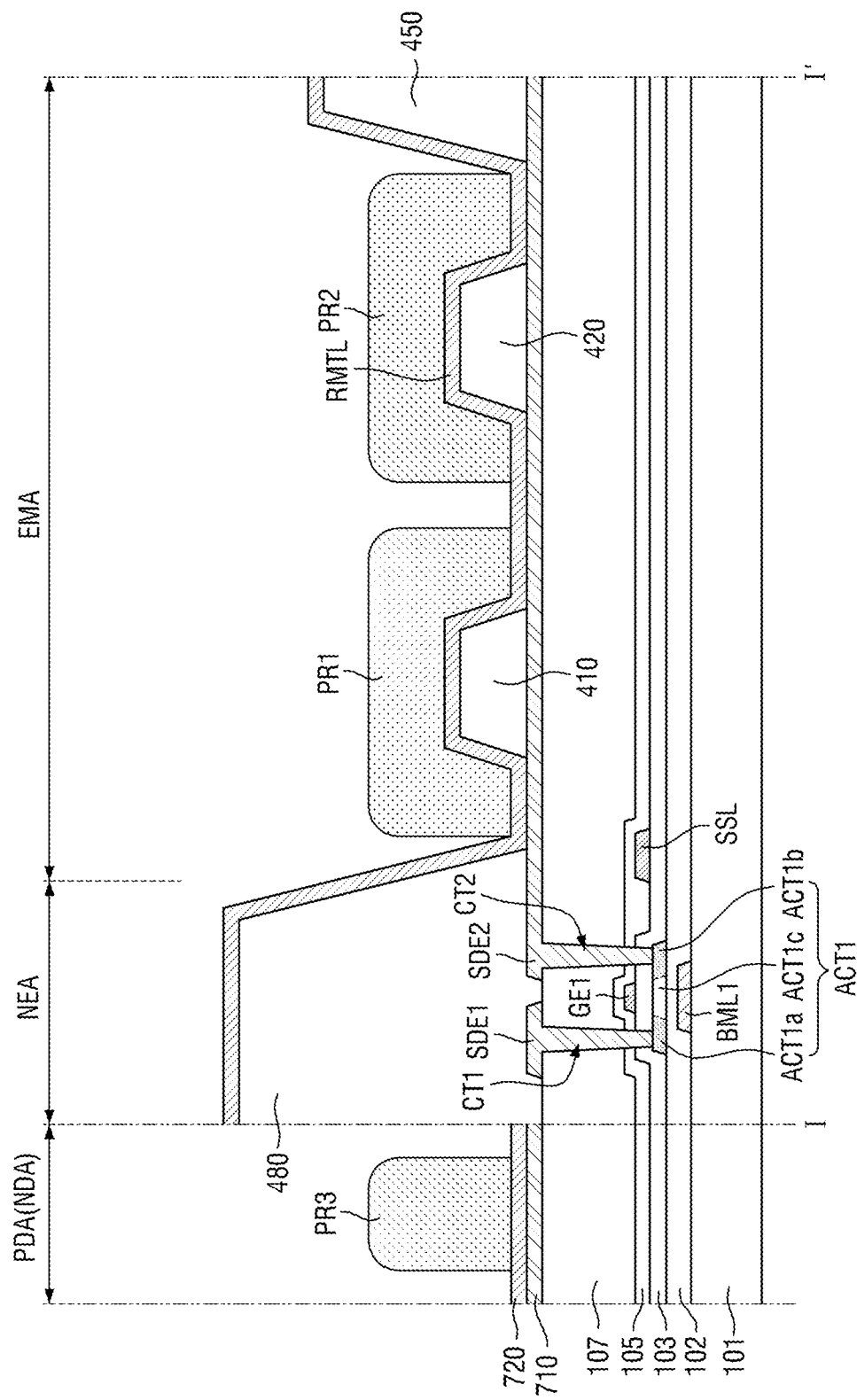
Figure 18:
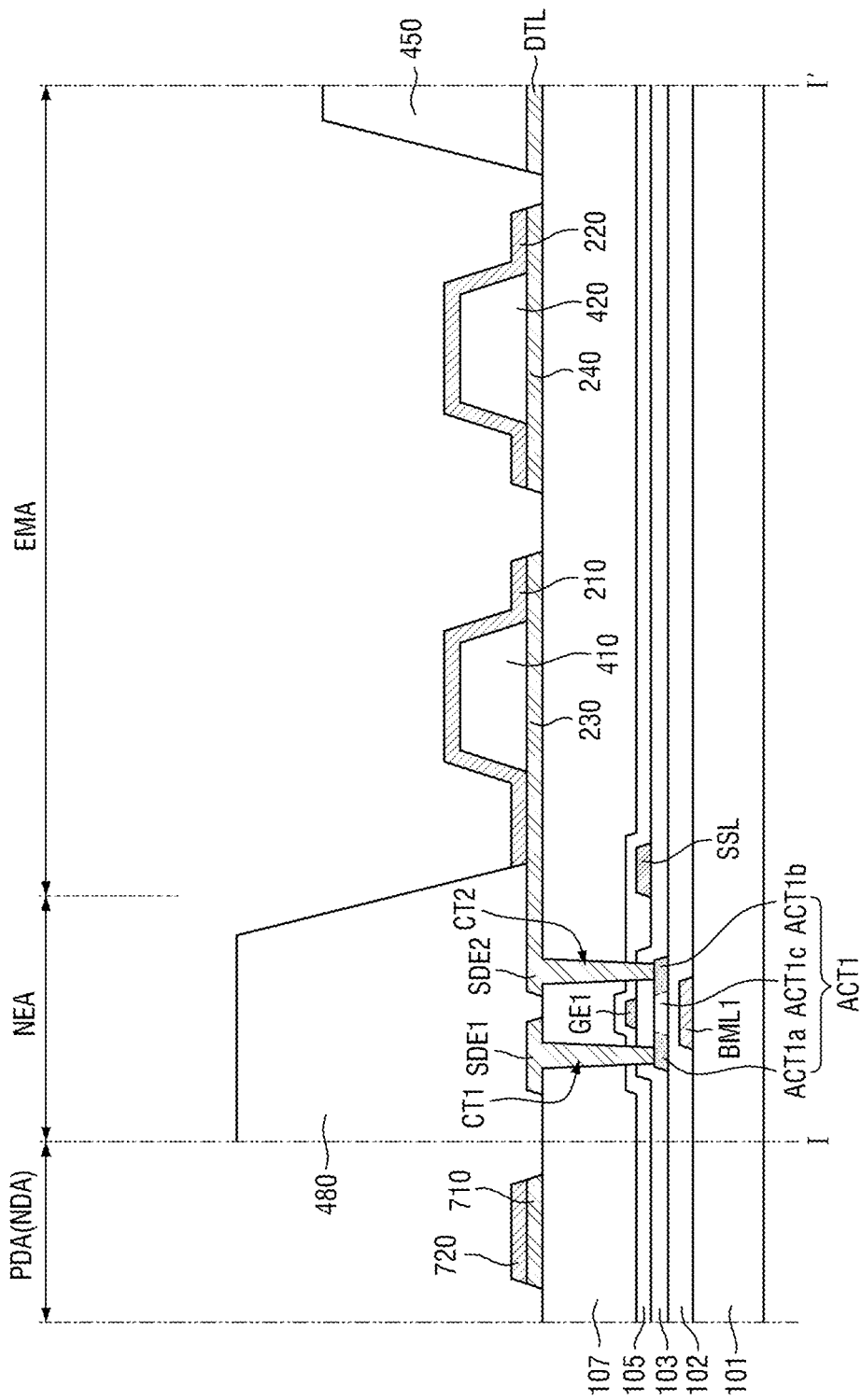

Next, referring to FIGS. 16 through 18, the electrode conductive layer RMTL is formed to cover the via layer and patterned at the same time as the second base conductive layer SDL2 to form the electrode base layers 230 and 240 and the electrodes 210 and 220.

First, referring to FIG. 16, the electrode conductive layer RMTL is formed on the entire surface of the first interlayer insulating layer 107. The electrode conductive layer RMTL may be formed of the same material as each electrode 210 or 220. The electrode conductive layer RMTL may be directly disposed on the via layer and the second base conductive layer SDL2 on which the via layer is not disposed. For example, the electrode conductive layer RMTL may be placed on the first planarization layer 480 of the non-emission area NEA and the inner banks 410 and 420 and the outer bank 450 of the emission area EMA to cover them. Here, the electrode conductive layer RMTL may also be disposed on inclined side surfaces of the inner banks 410 and 420. In some embodiments, the electrode conductive layer RMTL may be placed on the second base conductive layer SDL2 disposed in the pad area PDA.

Next, referring to FIGS. 17 and 18, the electrode conductive layer RMTL and the second conductive layer SDL2 are concurrently (e.g., simultaneously) patterned to form the electrode base layers 230 and 240 and the electrodes 210 and 220. The electrode base layers 230 and 240 and the electrodes 210 and 220 may be formed by a conventional patterning process. For example, photoresists PR1 through PR3 may be formed on the electrode conductive layer RMTL, and areas where the photoresists PR1 through PR3 are not disposed may be exposed and developed to form the electrode base layers 230 and 240 and the electrodes 210 and 220.

The photoresists PR1 through PR3 may be disposed on areas of the electrode conductive layer RMTL which correspond to areas where the electrode base layers 230 and 240 and the electrodes 210 and 220 are disposed. As illustrated in FIG. 17, a first photoresist PR1 may be disposed on an area of the electrode conductive layer RMTL which overlaps a first inner bank 410, and a second photoresist PR2 may be disposed on an area of the electrode conductive layer RMTL which overlaps a second inner bank 420. The electrode conductive layer RMTL and the second base conductive layer SDL2 on which the first photoresist PR1 and the second photoresist PR2 are disposed may be patterned to form a first electrode 210, a first electrode base layer 230, a second electrode 220 and a second electrode base layer 240. In some embodiments, a third photoresist PR3 may be placed on the electrode conductive layer RMTL disposed in the pad area PDA, and the pad base layer 710 and a pad electrode 720 may be formed in this area.

Referring to FIG. 18, the electrode conductive layer RMTL and the second base conductive layer SDL2 are patterned using the photoresists PR1 through PR3 to form the electrode base layers 230 and 240, the electrodes 210 and 220, the pad base layer 710 and the pad electrode 720. The second base conductive layer SDL2 and the electrode conductive layer RMTL in the areas where the photoresists PR1 through PR3 are not disposed may be removed by patterning, and the second base conductive layer SDL2 and the electrode conductive layer RMTL in the areas overlapping the photoresists PR1 through PR3 may be left. In the display device 10 according to the example embodiments, the electrode base layers 230 and 240 and the electrodes 210 and 220 may be patterned in the same process and may be disposed in substantially the same shape. In particular, the pad base layer 710 and the pad electrode 720 disposed in the pad area PDA may have substantially the same width. This has been described in detail above.

In areas where the via layer is disposed among the areas where the photoresists PR1 through PR3 are not disposed, the second base conductive layer SDL2 located under the via layer may not be patterned. The second base conductive layer SDL2 disposed under the first planarization layer 480 and the outer bank 450 may not be removed and may be formed to have the same width as the first planarization layer 480 and the outer bank 450. In particular, the second base conductive layer SDL2 disposed under the outer bank 450 may form a data line DTL disposed in each pixel PX or subpixel PXn. The data line DTL may be a portion remaining after the second base conductive layer SDL2 is patterned along the outer bank 450, and a side surface of the data line DTL may be exposed without contacting the outer bank 450. However, the side surface of the data line DTL may contact a first insulating layer 510 as described above.

Next, although not illustrated in the drawings, the first insulating layer 510 is formed on the first electrode 210 and the second electrode 220, and then the light emitting elements 300 are placed between the first electrode 210 and the second electrode 220 or between the first inner bank 410 and the second inner bank 420.

In some embodiments, the light emitting elements 300 dispersed in an ink (e.g., a predetermined or set ink) may be sprayed onto the emission area EMA of each pixel PX or subpixel PXn through an inkjet process and may be aligned between the first electrode 210 and the second electrode 220 through a process of forming an electric field between the first electrode 210 and the second electrode 220. When an alignment signal is transmitted to the first electrode 210 and the second electrode 220 after the light emitting elements 300 dispersed in the ink are sprayed onto the emission area EMA, an electric field may be formed between the electrodes 210 and 220, and a dielectrophoretic force may be applied to the light emitting elements 300 by the electric field. The dielectrophoretic force applied to the light emitting elements 300 may change the orientation direction and position of the light emitting elements 300 in the ink, thereby aligning the light emitting elements 300 between the first electrode 210 and the second electrode 220.

Here, any one of the first electrode 210 and the second electrode 220 may be grounded, and alternating current (AC) power may be applied to the other electrode. For example, when the first electrode 210 is grounded and AC power is applied to the second electrode 220, the AC power may be directly applied to the second electrode 220 instead of a second voltage wiring VSL. The process of applying AC power to the second electrode 220 may be performed through a wiring connected to the second electrode 220 during the manufacturing process of the display device 10, and then a process of disconnecting the wiring may be performed.

Next, a second insulating layer 520, contact electrodes 262 and 263, a third insulating layer 530, and a fourth insulating layer 550 are formed on the light emitting elements 300 to complete the display device 10.

Various embodiments of the display device 10 will now be described.

The first electrode 210 and the second electrode 220 may be electrically connected to the first data conductive layer disposed in the non-emission area NEA, for example, the source/drain electrodes SDE1 and SDE2 of the driving transistor DT or the second voltage wiring VSL. In FIGS. 5 and 6, the first electrode base layer 230 is directly connected to the second source/drain electrode SDE2 of the driving transistor DT, and the first electrode 210 is electrically connected to the driving transistor DT through the first electrode base layer 230. However, embodiments are not limited to this example. In some embodiments, the first electrode base layer 230 may be electrically connected to the driving transistor DT through a bridge pattern disposed on a different layer, or the first electrode 210 may be directly electrically connected to the driving transistor DT.

Figure 19:
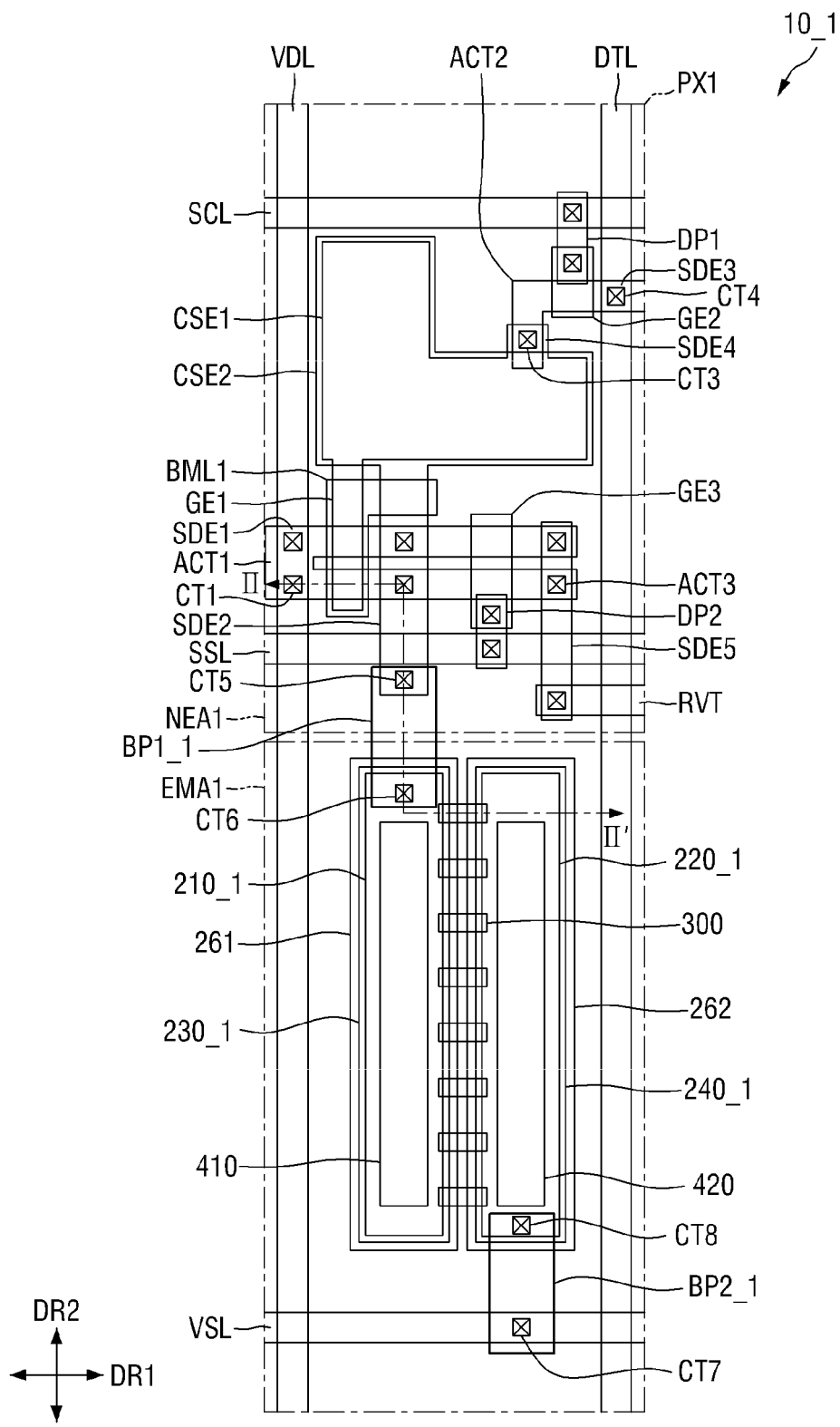
FIG. 19 is a layout view of a subpixel of a display device, according to some embodiments of the present disclosure.
Figure 20:
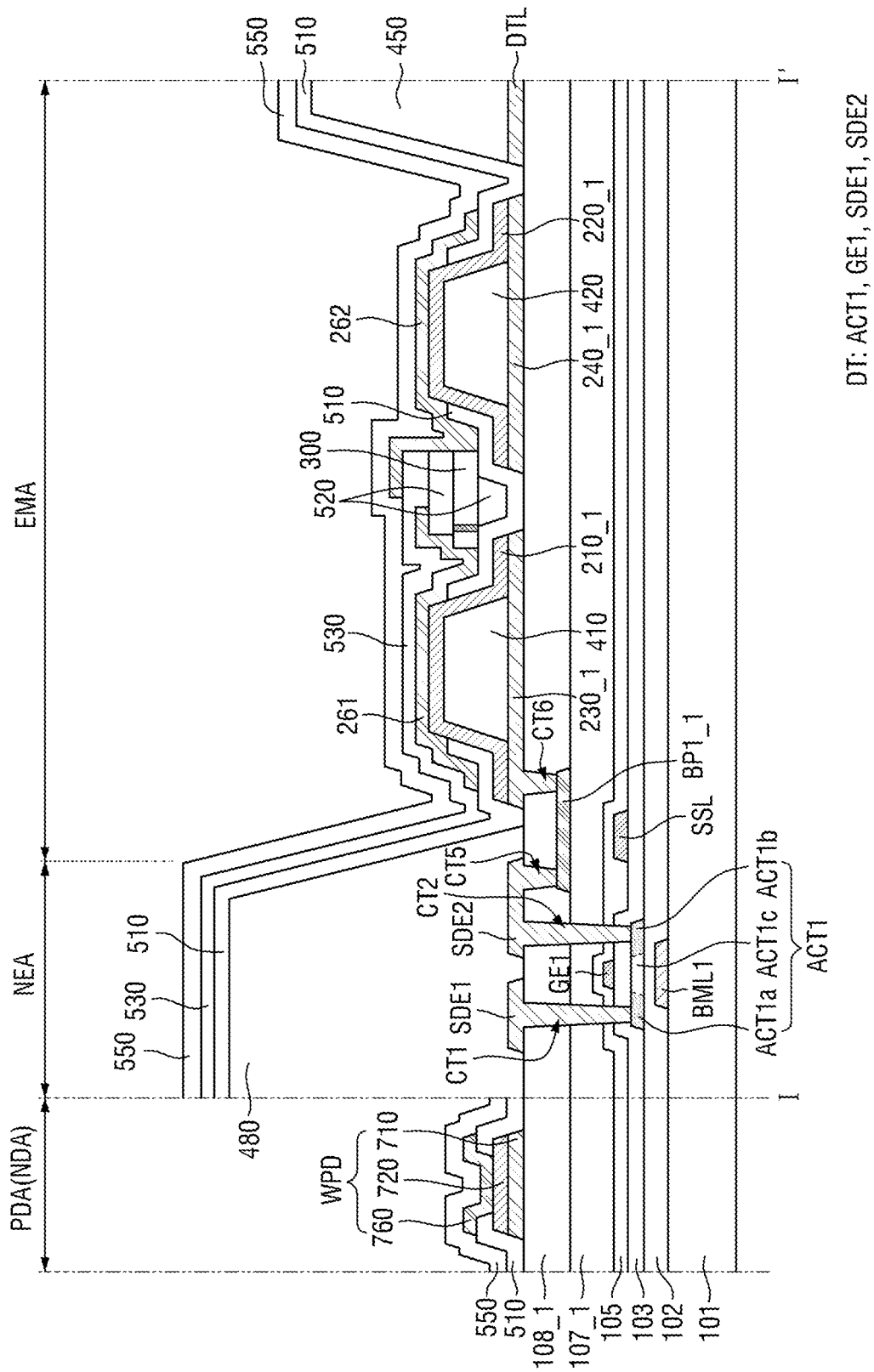
FIG. 20 is a cross-sectional view taken along the line II-II' of FIG. 19 and a portion of a non-display area, according to some embodiments of the present disclosure.

FIG. 19 is a layout view of a subpixel of a display device 10_1, according to some embodiments of the present disclosure. FIG. 20 is a cross-sectional view taken along the line II-II' of FIG. 19 and a portion of a non-display area NDA, according to some embodiments of the present disclosure.

Referring to FIGS. 19 and 20, the display device 10_1 according to the example embodiment may further include a first bridge pattern BP1_1 which is connected to a source/drain electrode of a driving transistor DT and a first electrode base layer 230_1 and a second bridge pattern BP2_1 which is connected to a second voltage wiring VSL and a second electrode base layer 240_1. The current embodiment is different from the embodiment of FIGS. 5 and 6 in that the first electrode base layer 230_1 and the source/drain electrode of the driving transistor DT are connected and the second electrode base layer 240_1 and the second voltage wiring VSL are connected through the bridge patterns BP1_1 and BP2_1, respectively, without being directly connected to each other. Any redundant description will be omitted, and differences will be mainly described below, as a person of ordinary skill in the art will be able to describe such elements from the details provided in other parts of this disclosure.

In the display device 10_1 of FIGS. 19 and 20, the first electrode base layer 230_1 may not be directly connected to the source/drain electrode of the driving transistor DT but may be electrically connected to the source/drain electrode of the driving transistor DT through the first bridge pattern BP1_1 disposed under the first electrode base layer 230_1. The second electrode base layer 240_1 may also not be directly connected to the second voltage wiring VSL but may be electrically connected to the second voltage wiring VSL through the second bridge pattern BP2_1 disposed under the second electrode base layer 240_1. In the current embodiment, a first interlayer insulating layer 107_1, a bridge pattern layer, and a second interlayer insulating layer 108_1 may be disposed between a first data conductive layer and a first protective layer 105.

The first interlayer insulating layer 107_1 is substantially the same as that described above with reference to FIG. 6. The first interlayer insulating layer 107_1 may be disposed on the first protective layer 105 to function as an insulating film between the first protective layer 105 and a conductive layer disposed on the first interlayer insulating layer 107_1. The second interlayer insulating layer 108_1 is disposed on the first interlayer insulating layer 107_1. The second interlayer insulating layer 108_1 may function as an insulating film between the bridge pattern layer disposed between the first interlayer insulating layer 107_1 and the second interlayer insulating layer 108_1 and the first data conductive layer disposed on the second interlayer insulating layer 108_1. In the current embodiment, the bridge pattern layer may be further disposed between the first data conductive layer and a first gate electrode layer, and a plurality of interlayer insulating layers 107_1 and 108_1 may be disposed between the first data conductive layer, the bridge pattern layer and the first gate electrode layer. Accordingly, members of the first data conductive layer which are connected to a conductive layer disposed under the first data conductive layer may be connected through contact holes penetrating the first interlayer insulating layer 107_1 and the second interlayer insulating layer 108_1. For example, source/drain electrodes SDE1 and SDE2 of the driving transistor DT may respectively contact portions of a first active material layer ACT1 through a first contact hole CT1 and a second contact hole CT2 penetrating the first interlayer insulating layer 107_1, the second interlayer insulating layer 108_1, the first protective layer 105, and a first gate insulating layer 103. The first interlayer insulating layer 107_1 and the second interlayer insulating layer 108_1 are the same as those described above, and thus a detailed description thereof will not be provided in detail, as a person of ordinary skill in the art will be able to describe such elements from the details provided in other parts of this disclosure.

The bridge pattern layer may include the first bridge pattern BP1_2 and the second bridge pattern BP2_1 and may be disposed between the first interlayer insulating layer 107_1 and the second interlayer insulating layer 108_1.

The first bridge pattern BP1_1 may be disposed between an emission area EMA and a non-emission area NEA to overlap the first electrode base layer 230_1 and a source/drain electrode of the driving transistor DT in the thickness direction. The first bridge pattern BP1_1 may be connected to the source/drain electrode of the driving transistor DT and the first electrode base layer 230_1 through contact holes CT5 and CT6 penetrating the second interlayer insulating layer 108_1. For example, the first bridge pattern BP1_1 may contact a second source/drain electrode SDE2 of the driving transistor DT through a fifth contact hole CT5 penetrating the second interlayer insulating layer 108_1 to expose a portion of an upper surface of the first bridge pattern BP1_1. In some embodiments, the first bridge pattern BP1_1 may contact the first electrode base layer 230_1 through a sixth contact hole CT6 penetrating the second interlayer insulating layer 108_1 to expose a portion of the upper surface of the first bridge pattern BP1_1.

Accordingly, the first electrode base layer 230_1 may be electrically connected to the driving transistor DT through the first bridge pattern BP1_1, and a first electrode 210_1 may be electrically connected to the driving transistor DT through the first electrode base layer 230_1 and the first bridge pattern BP1_1. In some embodiments, the first electrode base layer 230_1 and the first electrode 210_1 may be spaced from a boundary between the emission area EMA and the non-emission area NEA. For example, the first electrode base layer 230_1 and the first electrode 210_1 may be spaced from a first planarization layer 480.

In some embodiments, the second electrode base layer 240_1 may be electrically connected to the second voltage wiring VSL through the second bridge pattern BP2_1 (e.g., see FIG. 19) disposed between the first interlayer insulating layer 107_1 and the second interlayer insulating layer 108_1.

The second bridge pattern BP2_1 may be disposed in the emission area EMA under an outer bank 450 overlapping the second voltage wiring VSL. For example, the second bridge pattern BP2_1 may be disposed between the outer bank 450 and the second voltage wiring VSL to overlap them in the thickness direction and may also be disposed to overlap the second electrode base layer 240_1 in the thickness direction. The second bridge pattern BP2_1 may be connected to the second voltage wiring VSL and the second electrode base layer 240_1 through contact holes penetrating the first interlayer insulating layer 107_1 and the second interlayer insulating layer 108_1. For example, the second bridge pattern BP2_1 may contact the second voltage wiring VSL through a seventh contact hole CT7 penetrating the first interlayer insulating layer 107_1 to expose a portion of an upper surface of the second voltage wiring VSL. In some embodiments, the second bridge pattern BP2_1 may contact the second electrode base layer 240_1 through an eighth contact hole CT8 penetrating the second interlayer insulating layer 108_1 to expose a portion of an upper surface of the second bridge pattern BP2_1.

Accordingly, the second electrode base layer 240_1 may be electrically connected to the second voltage wiring VSL through the second bridge pattern BP2_1, and the second electrode 220_1 may be electrically connected to the second voltage wiring VSL through the second electrode base layer 240_1 and the second bridge pattern BP2_1. In some embodiments, the second electrode base layer 240_1 and a second electrode 220_1 may be spaced from the outer bank 450 in the emission area EMA.

As described above, the first electrode 210_1 can also be directly connected to a source/drain electrode of the driving transistor DT.

Figure 21:
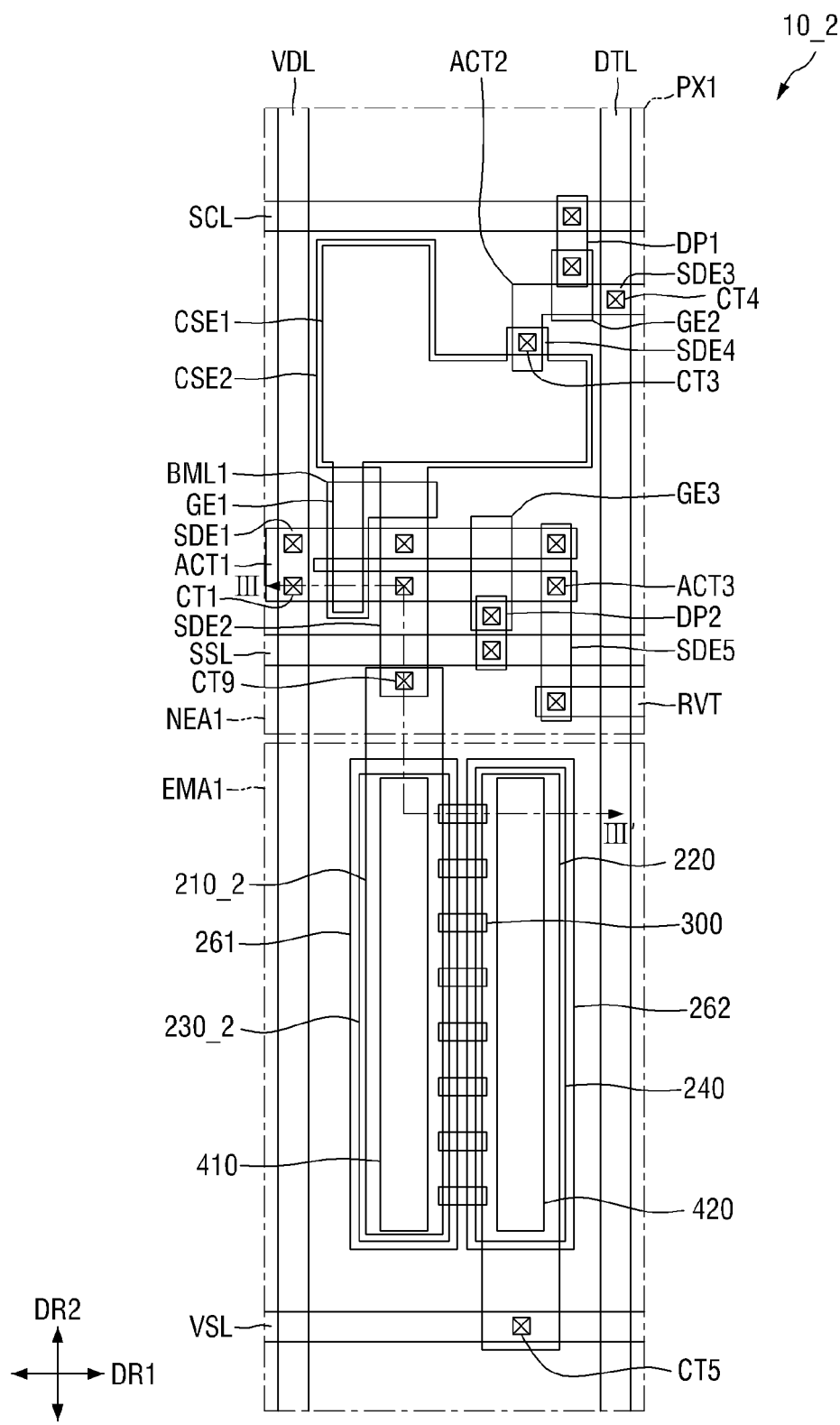
FIG. 21 is a layout view of a subpixel of a display device, according to some embodiments of the present disclosure.
Figure 22:
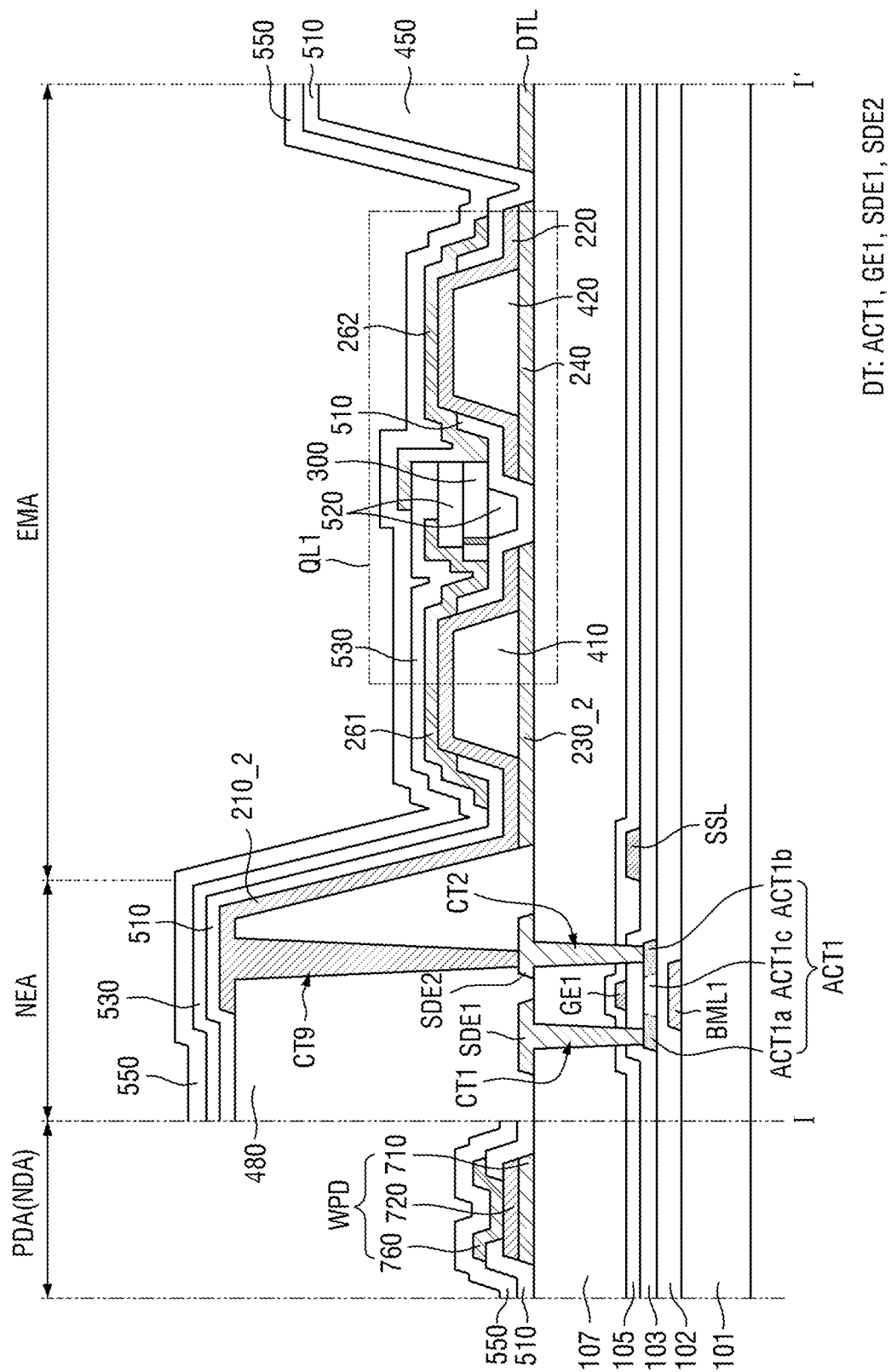
FIG. 22 is a cross-sectional view taken along the line III-III' of FIG. 21 and a portion of a non-display area, according to some embodiments of the present disclosure.

FIG. 21 is a layout view of a subpixel of a display device 10_2, according to some embodiments of the present disclosure. FIG. 22 is a cross-sectional view taken along the line III-III' of FIG. 21 and a portion of a non-display area NDA, according to some embodiments of the present disclosure.

Referring to FIGS. 21 and 22, in the display device 10_2 according to the example embodiment, at least a portion of a first electrode 210_2 may be disposed on a first planarization layer 480 of a non-emission area NEA and may be electrically connected to a driving transistor DT through a contact hole CT9 (see FIG. 21) penetrating the first planarization layer 480 to expose a source/drain electrode of the driving transistor DT. The current embodiment is different from the embodiment of FIGS. 5 and 6 in that the first electrode 210_2 is directly connected to the source/drain electrode of the driving transistor DT, and a first electrode base layer 230_2 is not electrically connected to the driving transistor DT. Any redundant description will be omitted, and differences will be mainly described below, as a person of ordinary skill in the art will be able to describe such elements from the details provided in other parts of this disclosure.

In the display device 10_2 of FIGS. 21 and 22, the first electrode base layer 230_2 may be spaced from the source/drain electrode of the driving transistor DT and may not be connected to the source/drain electrode of the driving transistor DT. When a second base conductive layer SDL2 is formed during the manufacturing process of the display device 10_2, source/drain electrodes SDE1 and SDE2 of the driving transistor DT may be spaced from other portions.

In some embodiments, before a process of forming an electrode conductive layer RMTL, the ninth contact hole CT9 is formed in the first planarization layer 480 to penetrate the first planarization layer 480 and expose a portion of an upper surface of the source/drain electrode of the driving transistor DT. Then, the electrode conductive layer RMTL formed entirely on the second base conductive layer SDL2 and a via layer may contact the source/drain electrode of the driving transistor DT through the ninth contact hole CT9, and the electrode conductive layer RMTL and the second base conductive layer SDL2 are patterned together to form the first electrode 210_2. The first electrode 210_2 may be directly connected to the driving transistor DT through the ninth contact hole CT9 penetrating the first planarization layer 480. Any redundant description will not be provided, as a person of ordinary skill in the art will be able to describe such elements from the details provided in other parts of this disclosure.

Figure 23:
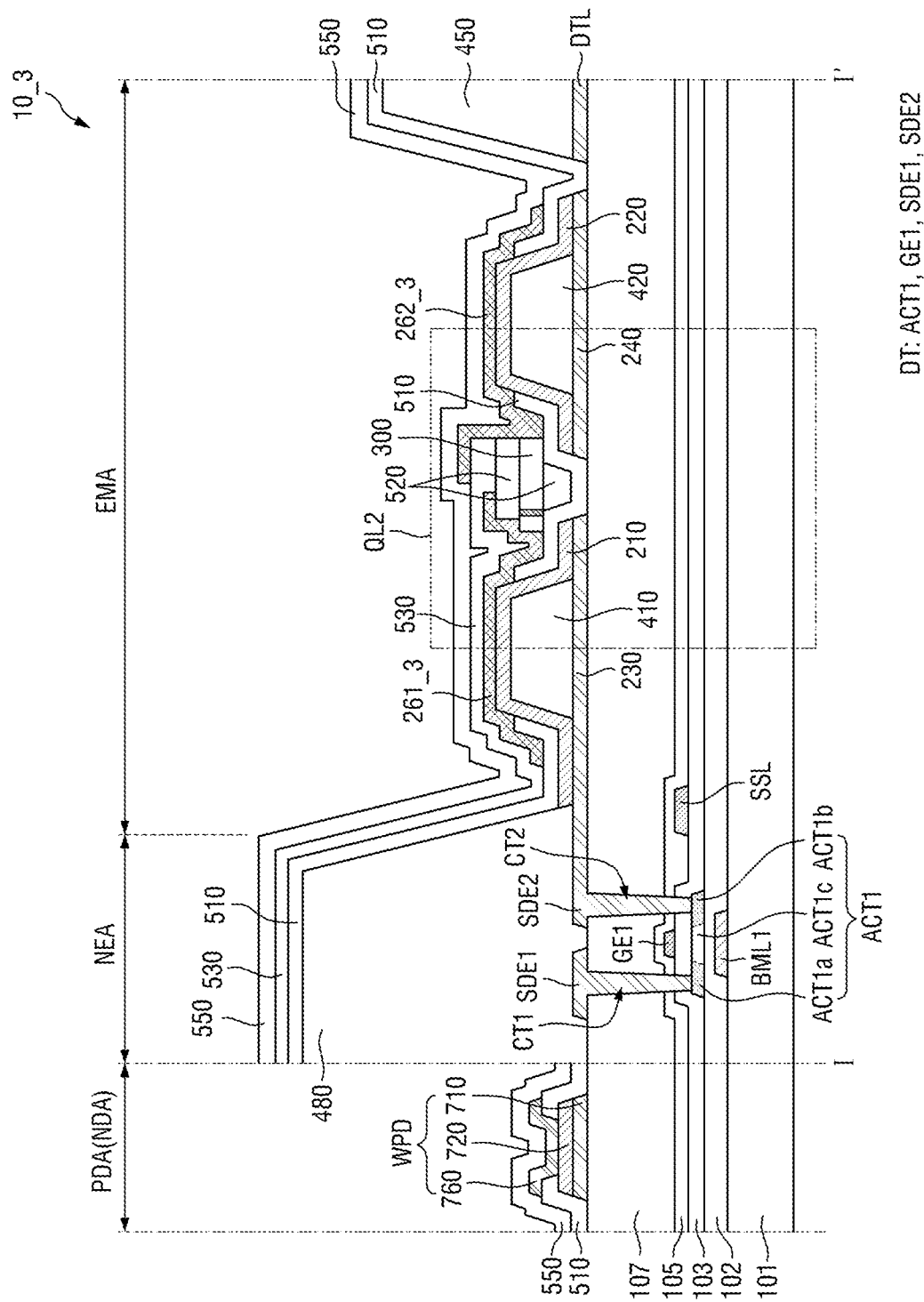
FIG. 23 is a cross-sectional view of a subpixel of a display device, according to some embodiments of the present disclosure.
Figure 24:
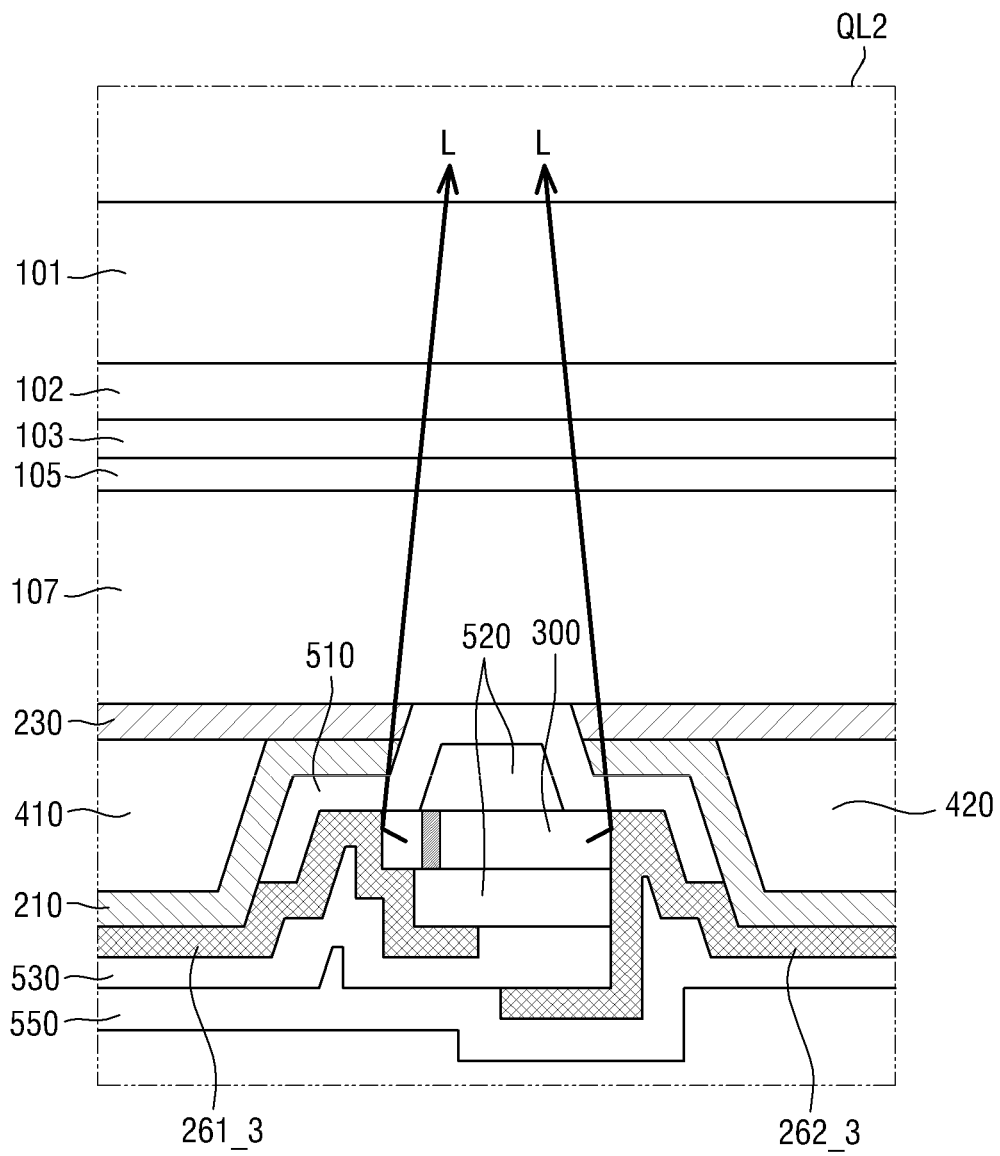
FIG. 24 is a schematic enlarged view of a part QL2 of FIG. 23, according to some embodiments of the present disclosure.

FIG. 23 is a cross-sectional view of a subpixel of a display device 10_3, according to some embodiments of the present disclosure. FIG. 24 is a schematic enlarged view of a part QL2 of FIG. 23, according to some embodiments of the present disclosure.

Referring to FIGS. 23 and 24, in the display device 10_3 according to the example embodiment, contact electrodes 261_3 and 262_3 contacting both ends of a light emitting element 300 may include a material having high reflectivity and reflect light emitted from the light emitting element 300 toward a lower surface of a first substrate 101. The current embodiment is different from the embodiment of FIG. 7 in that the display device 10_3 has a bottom emission structure because the contact electrodes 261_3 and 262_3 include a different material. Any redundant description will not be provided, and differences will be mainly described below, as a person of ordinary skill in the art will be able to describe such elements from the details provided in other parts of this disclosure.

In the display device 10_3 of FIGS. 23 and 24, each of a first contact electrode 261_3 and a second contact electrode 262_3 may include a material having high reflectivity to reflect light emitted from the light emitting element 300. The light emitting element 300 may receive electrical signals from electrodes 210 and 220 and the contact electrodes 261_3 and 262_3 and emit light of a specific wavelength band. The light may be generated by an active layer 330 of the light emitting element 300 and emitted through both ends of the light emitting element 300. Here, if the contact electrodes 261_3 and 262_3 contacting both ends of the light emitting element 300 include a material having high reflectivity, the light emitted from the light emitting element 300 may travel toward the lower surface of the first substrate 101. In some example embodiments, the contact electrodes 261_3 and 262_3 may include the same material as the electrodes 210 and 220.

Because the contact electrodes 261_3 and 262_3 are also disposed on a second insulating layer 520 disposed on the light emitting element 300, light emitted from the light emitting element 300 may be reflected toward a first insulating layer 510 and a first interlayer insulating layer 107 disposed under the light emitting element 300. In the display device 10_3 according to the example embodiment, an emission area EMA where the light emitting element 300 is disposed may be separated from a non-emission area NEA where circuit elements are disposed, and the light emitting element 300 may not overlap the circuit elements in the thickness direction. Accordingly, even if light travels toward the first insulating layer 510 on which the light emitting element 300 is disposed or the first interlayer insulating layer 107, it may not be reflected by conductive layers constituting the circuit elements. According to some embodiments, the contact electrodes 261_3 and 262_3 including a material having high reflectivity may reflect light emitted from the light emitting element 300 toward under the light emitting element 300, for example, toward the lower surface of the first substrate 101. Thus, the display device 10_3 may have a bottom emission structure.

A display device according to some embodiments includes an emission area in which light emitting elements are disposed and a non-emission area in which circuit elements are disposed, and the light emitting elements and the circuit elements may not overlap in the thickness direction. Electrodes electrically connected to the light emitting elements and electrode base layers electrically connected to the light emitting elements may be patterned in the same process during a manufacturing process. Inner banks may be disposed between the electrodes and the electrode base layers, and the light emitting elements may be disposed in an area formed by the inner banks.

In the display device according to some embodiments, wirings and electrodes disposed in the emission area and the non-emission area may be formed in the same process. Therefore, the number of manufacturing processes can be reduced.

In concluding the detailed description, those skilled in the art will appreciate that many variations and modifications can be made to the example embodiments without substantially departing from the principles of the present disclosure. Therefore, the disclosed example embodiments of the present disclosure are used in a generic and descriptive sense only and not for purposes of limitation.

What is claimed is:

1. A display device comprising:
   a substrate;
   a first electrode base layer and a second electrode base layer spaced from each other on the substrate;
   a first electrode on the first electrode base layer and a second electrode on the second electrode base layer;
   a first inner bank between the first electrode base layer and the first electrode and a second inner bank between the second electrode base layer and the second electrode; and
   a light emitting element between the first electrode and the second electrode, at least one end portion of the light emitting element being electrically connected to the first electrode or the second electrode,
   wherein a side surface of at least one end portion of each of the first electrode base layer and the second electrode base layer is at the same line as a side surface of an end portion of a corresponding one of the first electrode and the second electrode.

2. The display device of claim 1, wherein the first electrode covers an outer surface of the first inner bank, and the second electrode covers an outer surface of the second inner bank.

3. The display device of claim 2, wherein at least a portion of a lower surface of the first electrode directly contacts an upper surface of the first electrode base layer, and at least a portion of a lower surface of the second electrode directly contacts an upper surface of the second electrode base layer.

4. The display device of claim 3, wherein at least one side surface of each of the first electrode base layer and the second electrode base layer does not contact a corresponding one of the first electrode and the second electrode.

5. The display device of claim 3, wherein the first electrode and the second electrode do not directly contact the substrate.

6. The display device of claim 3, wherein the first inner bank and the second inner bank are directly on the first electrode base layer and the second electrode base layer, respectively.

7. The display device of claim 2, wherein a distance between the first electrode and the second electrode is smaller than a distance between the first inner bank and the second inner bank.

8. The display device of claim 7, wherein at least one end portion of the light emitting element is on the first electrode or the second electrode.

9. The display device of claim 2, further comprising a first insulating layer between the first electrode and the second electrode, and covering at least a portion of each of the first electrode and the second electrode,
wherein the light emitting element is on the first insulating layer.

10. The display device of claim 9, wherein the first electrode base layer and the second electrode base layer directly contact the first insulating layer.

11. The display device of claim 9, further comprising:
a first contact electrode contacting an end portion of the light emitting element and the first electrode; and
a second contact electrode contacting the other end portion of the light emitting element and the second electrode.

12. The display device of claim 1, wherein the substrate comprises an emission area and a non-emission area, and
the first electrode, the second electrode, and the light emitting element are in the emission area,
wherein the display device further comprises a first data conductive layer in the non-emission area.

13. The display device of claim 12, further comprising a first interlayer insulating layer on the substrate,
wherein the first data conductive layer and the first electrode base layer are directly on the first interlayer insulating layer.

14. The display device of claim 13, wherein the first electrode is electrically connected to the first data conductive layer.

15. The display device of claim 12, wherein the substrate further comprises a non-display area, and
wherein the non-emission area further comprises a pad base layer in the non-display area and a pad electrode on the pad base layer.

16. The display device of claim 15, wherein the pad base layer is at the same layer as the first electrode base layer, and the pad electrode is at the same layer as the first electrode.

17. The display device of claim 12, further comprising:
a first planarization layer on the first data conductive layer in the non-emission area; and
an outer bank surrounding the first electrode and the second electrode in the emission area,
wherein the first planarization layer, the outer bank, and the first inner bank are at the same layer.

18. The display device of claim 17, wherein the first planarization layer, the outer bank, and the first inner bank have different heights.

19. The display device of claim 17, further comprising a data line between the outer bank and the substrate, wherein at least one side surface of the data line does not contact the outer bank.

20. A display device comprising:
a substrate having an emission area and a non-emission area;
a first interlayer insulating layer on the substrate;
a first data conductive layer on the first interlayer insulating layer and comprising a plurality of electrode base layers in the emission area and source/drain electrodes of a driving transistor;
a via layer on the first data conductive layer and comprising a first planarization layer in the non-emission area and inner banks on the electrode base layers;
a plurality of electrodes on the electrode base layers; and
a plurality of light emitting elements between the electrodes,
wherein the electrode base layers comprise a first electrode base layer and a second electrode base layer spaced from the first electrode base layer,
wherein the electrodes comprise a first electrode on the first electrode base layer and a second electrode on the second electrode base layer,
wherein the light emitting elements are between the first electrode and the second electrode,
wherein the inner banks comprise a first inner bank between the first electrode base layer and the first electrode, and
wherein an outer edge of the first electrode base layer fully surrounds an outer edge of the first inner bank in a plan view.

21. The display device of claim 20, wherein the inner banks further comprise a second inner bank between the second electrode base layer and the second electrode, and
wherein the first electrode and the second electrode cover outer surfaces of the first inner bank and the second inner bank, respectively.

22. The display device of claim 21, wherein a width of the first inner bank measured in a direction is smaller than a width of the first electrode base layer measured in the direction.

23. The display device of claim 22, wherein at least a portion of a lower surface of the first electrode directly contacts the first electrode base layer.

24. The display device of claim 20, wherein a height of the first planarization layer is greater than heights of the inner banks.

25. A display device comprising:
a substrate having an emission area and a non-emission area;
a first interlayer insulating layer on the substrate;
a first data conductive layer on the first interlayer insulating layer and comprising source/drain electrodes of a driving transistor in the non-emission area and a plurality of electrode base layers in the emission area;
a via layer on the first data conductive layer and comprising a first planarization a plurality of electrodes on the electrode base layers; and
layer in the non-emission area and inner banks on the electrode base layers;
a plurality of light emitting elements between the electrodes,
wherein the electrode base layers comprise a first electrode base layer and a second electrode base layer spaced from the first electrode base layer,
wherein the electrodes comprise a first electrode on the first electrode base layer and a second electrode on the second electrode base layer,
wherein the light emitting elements are between the first electrode and the second electrode, wherein a height of the first planarization layer is greater than heights of the inner banks,
wherein the via layer further comprises an outer bank at a periphery of the emission area, and
wherein a height of the outer bank is greater than the heights of the inner banks but is less than the height of the first planarization layer.

26. The display device of claim 20, wherein the substrate further comprises a non-display area,
wherein the first data conductive layer further comprises a pad base layer in the non-display area, and
wherein a pad electrode is further located on the pad base layer.

27. The display device of claim 26, wherein the pad electrode is at the same layer as the first electrode.

28. The display device of claim 26, wherein a width of the pad base layer measured in a direction is substantially the same as a width of the pad electrode measured in the direction.

29. The display device of claim 20, further comprising:
a semiconductor layer on the non-emission area of the substrate and comprising a first active material layer of the driving transistor;
a first gate insulating layer on the semiconductor layer; and
a first gate electrode of the driving transistor on the first gate insulating layer,
wherein the source/drain electrodes of the driving transistor contact the first active material layer through contact holes penetrating the first interlayer insulating layer and the first gate insulating layer.

* * * * *